US012575043B2

(12) United States Patent
Cho et al.

(10) Patent No.: US 12,575,043 B2
(45) Date of Patent: Mar. 10, 2026

(54) ELECTRONIC APPARATUS COMPRISING DRIVER FOR DRIVING HOUSING

(71) Applicant: Samsung Electronics Co., Ltd., Suwon-si (KR)

(72) Inventors: Sunggun Cho, Suwon-si (KR); Hwamok Pak, Suwon-si (KR); Jinwook Baik, Suwon-si (KR); Byounguk Yoon, Suwon-si (KR); Yeonggyu Yoon, Suwon-si (KR); Youngmin Kang, Suwon-si (KR); Junghyeob Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 18/675,791

(22) Filed: May 28, 2024

(65) Prior Publication Data

US 2024/0314951 A1     Sep. 19, 2024

Related U.S. Application Data

(63) Continuation of application No. PCT/KR2022/020732, filed on Dec. 19, 2022.

(30) Foreign Application Priority Data

Mar. 25, 2022    (KR) ........................ 10-2022-0037285
Apr. 29, 2022    (KR) ........................ 10-2022-0053530

(51) Int. Cl.
*H05K 5/02*        (2006.01)
*G06F 1/16*        (2006.01)
(52) U.S. Cl.
CPC ......... *H05K 5/0217* (2013.01); *G06F 1/1624* (2013.01); *G06F 1/1652* (2013.01)

(58) Field of Classification Search
CPC .... H05K 5/0217; G06F 1/1624; G06F 1/1652
See application file for complete search history.

(56) References Cited

U.S. PATENT DOCUMENTS 8,711,566 B2 *  4/2014  O'Brien ................ G06F 1/1652
                                                      361/724
10,938,970 B1   3/2021  Lee et al.
                (Continued)

FOREIGN PATENT DOCUMENTS

CN        111508372 A      8/2020
CN        111510536 A      8/2020
                (Continued)

OTHER PUBLICATIONS

Extended European Search Report dated Sep. 13, 2024, issued in European Application No. 22823312.8-1218.
(Continued)

*Primary Examiner* — Sagar Shrestha
(74) *Attorney, Agent, or Firm* — Jefferson IP Law, LLP

(57)                ABSTRACT

An electronic apparatus according to an embodiment comprises a first housing, a second housing, a display, a motor disposed in the first housing and providing the second housing with a driving force, a driving gear coupled to the motor, at least one transmitting gear which is engaged with the driving gear so as to be rotatable about a rotary shaft that is perpendicular to the rotary shaft of the driving gear according to the rotation of the driving gear, and a rack gear which is moved according to the rotation of the at least one transmitting gear, wherein the rack gear comprises a plurality of teeth engaged with the at least one transmitting gear, and has a gear surface facing a direction perpendicular to a direction in which one surface of the second housing faces.

20 Claims, 23 Drawing Sheets

(56) References Cited

U.S. PATENT DOCUMENTS

| | | | |
|---|---|---|---|
| 11,051,413 B2 | 6/2021 | Yang et al. | |
| 11,315,447 B2* | 4/2022 | Feng | G06F 1/1652 |
| 11,474,565 B2 | 10/2022 | Choi et al. | |
| 11,800,657 B2* | 10/2023 | Jiang | G06F 1/1637 |
| 11,805,605 B2 | 10/2023 | Yoon et al. | |
| 11,815,948 B2 | 11/2023 | Song et al. | |
| 11,921,545 B2* | 3/2024 | Feng | H04M 1/0268 |
| 12,222,756 B2* | 2/2025 | Zhao | H04M 1/0268 |
| 2013/0058063 A1* | 3/2013 | O'Brien | G06F 1/1624 |
| | | | 361/807 |
| 2020/0264660 A1* | 8/2020 | Song | H04M 1/0237 |
| 2022/0021759 A1 | 1/2022 | Lim et al. | |
| 2022/0361347 A1* | 11/2022 | Feng | G06F 1/1624 |
| 2023/0095247 A1* | 3/2023 | Feng | G06F 1/1624 |
| | | | 361/679.27 |
| 2023/0199984 A1* | 6/2023 | Jung | H05K 5/0217 |
| | | | 361/807 |
| 2023/0266793 A1 | 8/2023 | Zhou | |
| 2024/0032214 A1* | 1/2024 | Jiang | G09F 9/301 |
| 2024/0064916 A1 | 2/2024 | Feng | |

FOREIGN PATENT DOCUMENTS

| | | |
|---|---|---|
| CN | 111882994 A | 11/2020 |
| CN | 112303421 A | 2/2021 |
| CN | 113067915 A | 7/2021 |
| CN | 113746970 A | 12/2021 |
| KR | 10-2006-0111862 A | 10/2006 |
| KR | 10-1107127 B1 | 1/2012 |
| KR | 10-2020-0144822 A | 12/2020 |
| KR | 10-2274481 B1 | 7/2021 |
| KR | 10-2021-0116542 A | 9/2021 |
| KR | 10-2023-0002599 A | 1/2023 |
| WO | 2021/112291 A1 | 6/2021 |

OTHER PUBLICATIONS

International Search Report dated Mar. 17, 2023, issued in International Patent Application No. PCT/KR2022/020732.

* cited by examiner

ELECTRONIC APPARATUS COMPRISING DRIVER FOR DRIVING HOUSING

CROSS-REFERENCE TO RELATED APPLICATION(S)

This application is a continuation application, claiming priority under § 365(c), of an International application No. PCT/KR2022/020732, filed on Dec. 19, 2022, which is based on and claims the benefit of a Korean patent application number 10-2022-0037285, filed on Mar. 25, 2022, in the Korean Intellectual Property Office, and of a Korean patent application number 10-2022-0053530, filed on Apr. 29, 2022, in the Korean Intellectual Property Office, the disclosure of each of which is incorporated by reference herein in its entirety.

TECHNICAL FIELD

Various embodiments relate to an electronic device including a driver for driving a housing.

BACKGROUND ART

In order for a user to easily carry his/her electronic devices, the electronic devices require to be miniaturized. Notwithstanding the miniaturization of these electronic devices, there is still an increasing need for an electronic device in which a screen size of a display for displaying contents may be changed so that the user can utilize various contents through the electronic device. For example, such an electronic device may include a flexible display with a changeable screen size of a display being exposed to the outside of the electronic device.

DISCLOSURE

Technical Problem

In a flexible display of an electronic device, for example, the area of the display may be expanded or reduced according to movement of a housing. In order to move the housing, the electronic device may include a driving module having a motor for providing a driving force to the housing and a transmission gear for transmitting the driving force of the motor to the housing. As the size of the driving module is increased to smoothly drive the housing, the thickness of the electronic device may increase unnecessarily. The electronic device may need to optimize the arrangement structure of the driving module in the electronic device.

The technical problems to be addressed in this disclosure are not limited to those described above, and other technical problems not mentioned herein will be clearly understood by those having ordinary knowledge in the technical field to which the present disclosure belongs, from the following description.

Technical Solution

According to an embodiment, an electronic device includes a first housing, a second housing movably coupled to the first housing, and a display disposed on one surface of the second housing and expanded or contracted according to movement of the second housing. According to an embodiment, an electronic device includes a motor disposed in the first housing and configured to provide a driving force to the second housing, and a driving gear coupled to the motor to be rotatable with respect to the motor. According to an embodiment, an electronic device includes at least one transmitting gear engaged with the driving gear to be rotatable with respect to a rotation axis perpendicular to a rotation axis of the driving gear by rotation of the driving gear, and a rack gear disposed on the second housing and being moved by rotation of the at least one transmitting gear. According to an embodiment, the rack gear includes a gear surface facing a direction perpendicular to a direction that the one surface of the second housing faces, the gear surface including a plurality of teeth engaged with the at least one transmitting gear.

According to an embodiment, an electronic device includes a first housing, a second housing movably coupled to the first housing, and a display including a first region disposed on one surface of the second housing and a second region configured to be deformable according to movement of the second housing. According to an embodiment, an electronic device includes a supporting member including at least one bar extending in a direction perpendicular to a moving direction of the second housing, the supporting member disposed in the second region of the display. According to an embodiment, an electronic device includes a guide rail disposed in the first housing and configured to guide movement of the supporting member. According to an embodiment, an electronic device includes a motor disposed in the first housing and configured to provide a driving force to the second housing, a driving gear coupled to the motor to be rotatable with respect to the motor, and at least one transmitting gear engaged with the driving gear to be rotatable with respect to a rotation axis perpendicular to a rotation axis of the driving gear by rotation of the driving gear. According to an embodiment, an electronic device includes a rack gear including a gear surface facing a direction perpendicular to a direction the one surface of the second housing faces, the gear surface including a plurality of teeth engaged with the at least one transmitting gear, the rack gear being disposed on the second housing, the rack gear moving by rotation of the at least one transmitting gear. According to an embodiment, the guide rail includes an operating space for accommodating at least part of the rack gear.

Advantageous Effects

An electronic device according to an embodiment can secure a driving force enough to move a housing while providing a space for other components within the electronic device, by means of a rack gear in which a gear surface with a plurality of teeth thereon is disposed perpendicular to at least a portion of a display.

The effects that can be obtained from the disclosure are not limited to those described above, and any other effects not mentioned herein will be clearly understood by those having ordinary knowledge in the technical field to which the disclosure belongs, from the following description.

MODE FOR INVENTION

Figure 1:
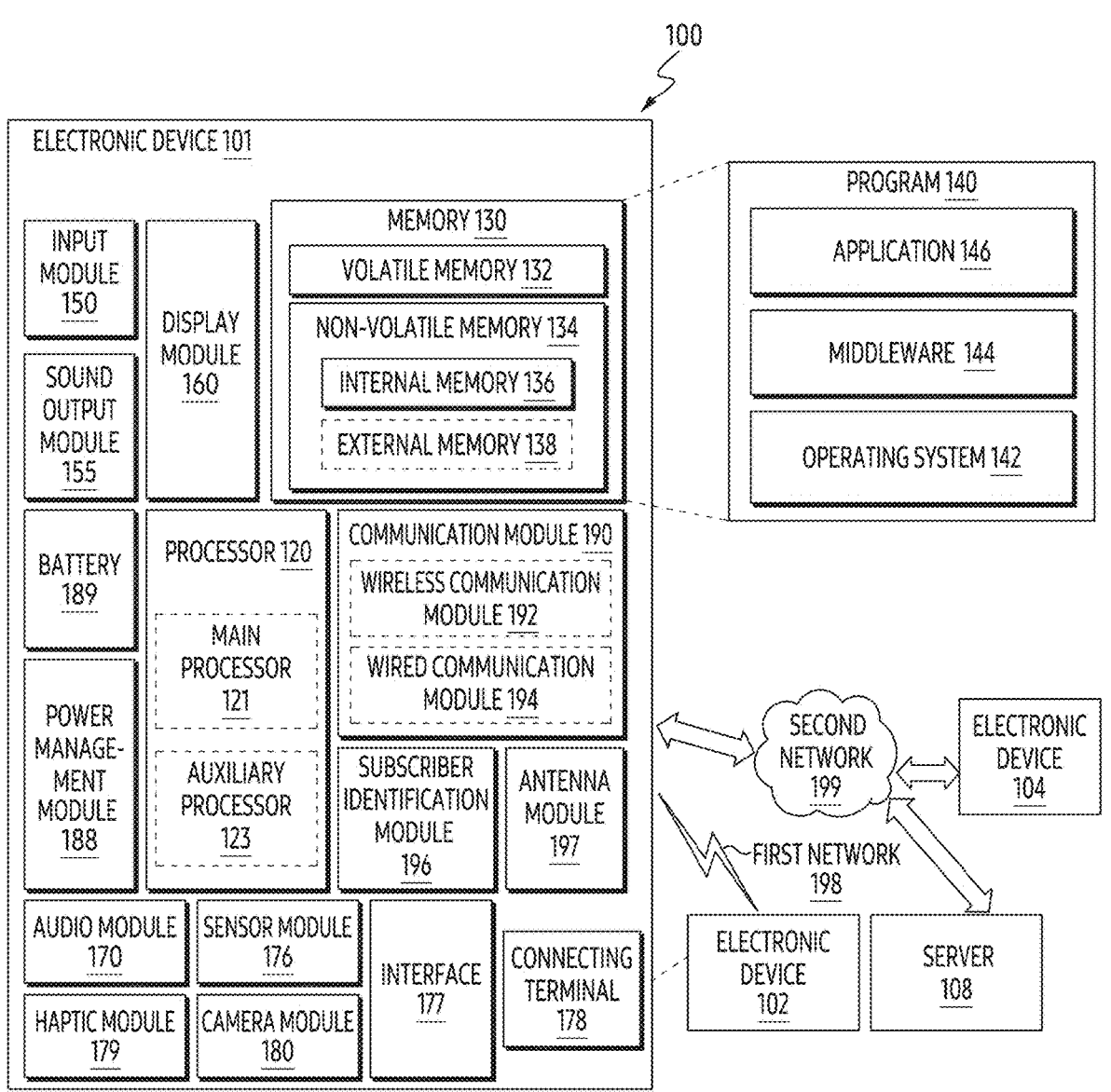
FIG. 1 is a block diagram illustrating an electronic device in a network environment according to various embodiments.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to address, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments, the antenna module 197 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
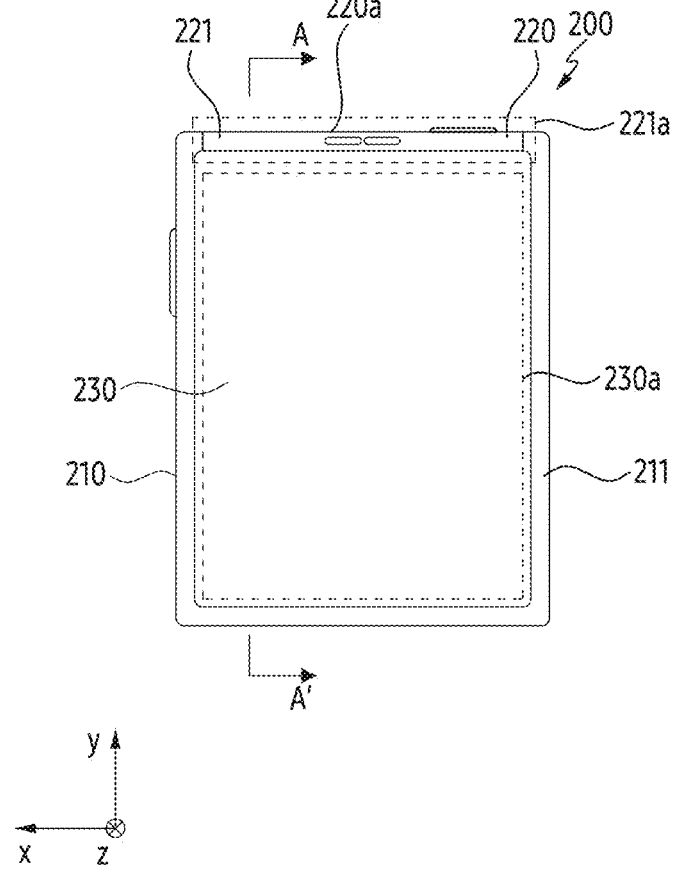
FIG. 2A is a front view illustrating a first state of an electronic device according to an embodiment.
Figure 2B:
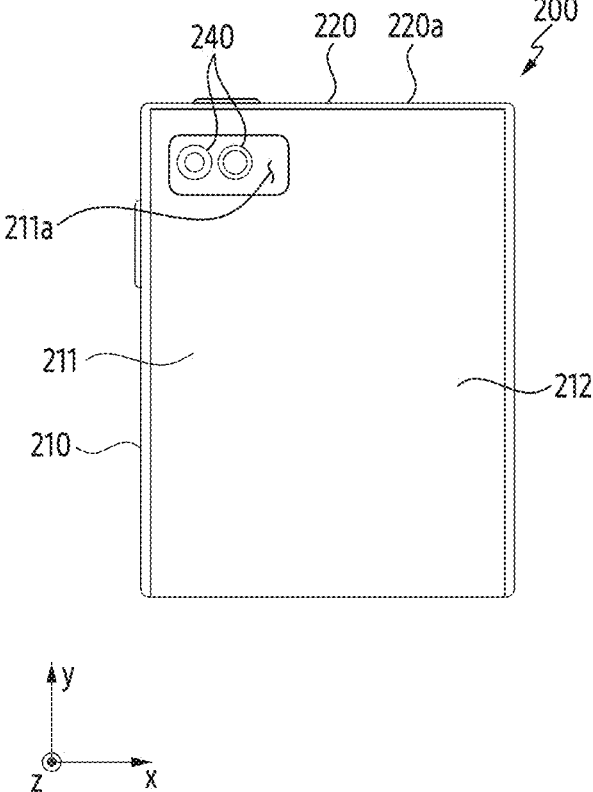
FIG. 2B is a rear view illustrating a first state of an electronic device according to an embodiment.
Figure 2C:
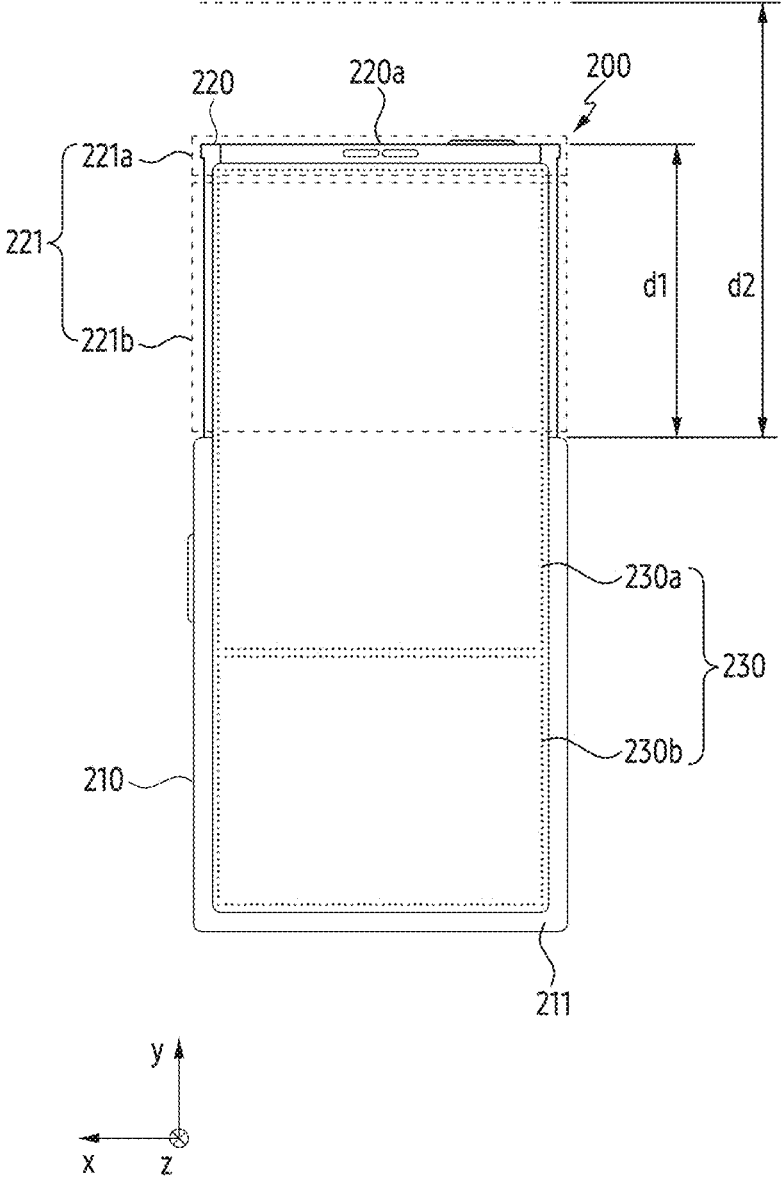
FIG. 2C is a front view illustrating a second state of an electronic device according to an embodiment.
Figure 2D:
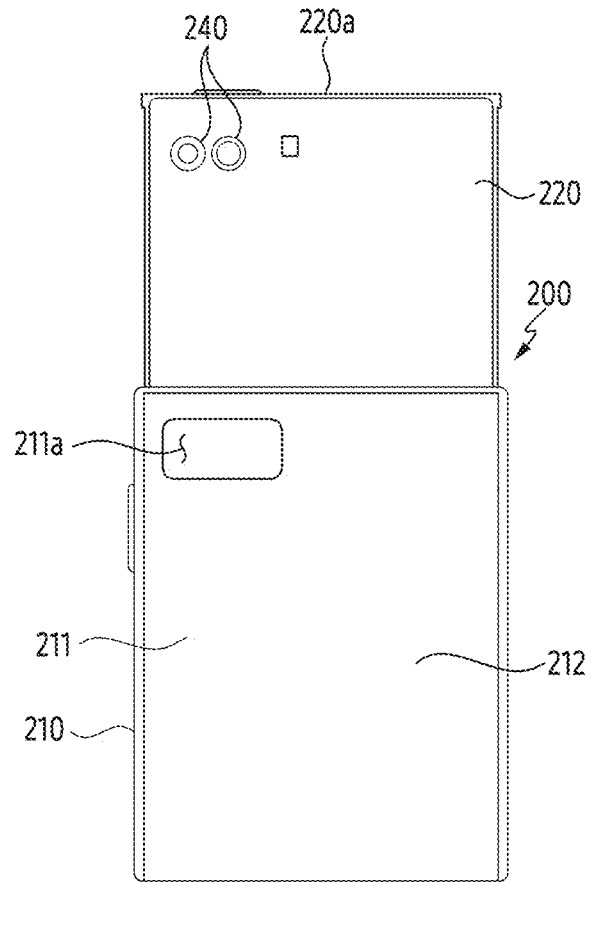
FIG. 2D is a rear view illustrating a second state of an electronic device according to an embodiment.

FIG. 2A is a front view of an electronic device in a first state according to an embodiment, FIG. 2B is a rear view of the first state of the electronic device according to an embodiment, FIG. 2C is a front view of a second state of the electronic device according to an embodiment, and FIG. 2D is a rear view of the second state of the electronic device according to an embodiment.

Referring to FIGS. 2A, 2B, 2C, and 2D, an electronic device 200 (e.g., the electronic device 101 of FIG. 1) according to an embodiment may include a first housing 210, a second housing 220, a display 230 (e.g., the display module 160 of FIG. 1), and a camera 240 (e.g., the camera module 180 of FIG. 1). According to an embodiment, the second housing 220 may be slidable with respect to the first housing 210. For example, the second housing 220 may move within a range of a specified distance along a first direction (e.g., +y direction) with respect to the first housing 210.

When the second housing 220 moves in the first direction, a distance between a side surface 220a of the second housing 220 facing the first direction and the first housing 210 may increase. For another example, the second housing 220 may move within a range of a specified distance along a second direction (e.g., −y direction) opposite to the first direction with respect to the first housing 210. When the second housing 220 moves in the second direction, the distance between the side surface 220a of the second housing 220 facing the first direction and the first housing 210 may decrease. According to an embodiment, the second housing 220 may linearly reciprocate with respect to the first housing 210 while sliding relative to the first housing 210. For example, at least a portion of the second housing 220 may be slidable into the first housing 210 or slidable out from the first housing 210.

According to an embodiment, the electronic device 200 may be referred to as a "slidable electronic device", as the second housing 220 is designed to be slidable with respect to the first housing 210. According to an embodiment, the electronic device 200 may be referred to as a "rollable electronic device", as at least a portion of the display 230 is designed to be rolled up into the second housing 220 (or the first housing 210) based on a sliding movement of the second housing 220.

According to an embodiment, the first state of the electronic device 200 may be defined as a state in which the second housing 220 is moved in the second direction (e.g., a contracted state or a slide-in state). For example, in the first state of the electronic device 200, the second housing 220 may be movable in the first direction, but may not be movable in the second direction. In the first state of the electronic device 200, the distance between the side surface 220a of the second housing 220 and the first housing 210 may increase as the second housing 220 moves, but it may not decrease any more. For another example, in the first state of the electronic device 200, a portion of the second housing 220 may be slidable-out from the first housing 210, but it may not be slidable-in any more. According to an embodiment, the first state of the electronic device 200 may be defined as a state in which a second region 230b of the display 230 is not visually exposed from the outside of the electronic device 200. For example, in the first state of the electronic device 200, the second region 230b of the display 230 may located in an internal space of the electronic device 200 formed by the first housing 210 and/or the second housing 220, so that it is not visible from the outside of the electronic device 200.

According to an embodiment, the second state of the electronic device 200 may be defined as a state in which the second housing 220 is moved in the first direction (e.g., an extended state or a slide-out state). For example, in the second state of the electronic device 200, the second housing 220 may be movable in the second direction, but may not be movable in the first direction any more. In the second state of the electronic device 200, the distance between the side surface 220a of the second housing 220 and the first housing 210 may decrease as the second housing 220 moves, but it may not increase further. For another example, in the second state of the electronic device 200, a portion of the second housing 220 may be slidable into the first housing 210, but it may not be slidable out from the first housing 210 further. According to an embodiment, the second state of the electronic device 200 may be defined as a state in which the second region 230b of the display 230 is visually exposed from the outside of the electronic device 200. For example, in the second state of the electronic device 200, the second region 230b of the display 230 may be drawn out from the internal space of the electronic device 200 so that it visible from the outside of the electronic device 200.

According to an embodiment, when the second housing 220 moves from the first housing 210 in the first direction, at least a portion of the second housing 220 and/or the second region 230b of the display 230 may be draw out from the first housing 210 by a pull-out length d1 corresponding to the moving distance of the second housing 220. According to an embodiment, the second housing 220 may reciprocate within a specified distance d2. According to an embodiment, the pull-out length d1 may have substantially a dimension ranging from zero to the specified distance d2.

According to an embodiment, the state of the electronic device 200 may be convertible between the second state and/or the first state, with either a manual operation by a user or an automatic operation by a driving module (not shown) arranged inside the first housing 210 or the second housing 220. According to an embodiment, the driving module may trigger a certain operation based on a user input. According to an embodiment, the user input for triggering the operation of the driving module may include a touch input through the display 230, a force touch input, and/or a gesture input. According to another embodiment, the user input for triggering the operation of the driving module may include a voice input or an input of a physical button exposed to the outside of the first housing 210 or the second housing 220. According to an embodiment, the driving module may be configured to be driven in a semi-automatic manner in which an operation is triggered upon detection of such a manual operation using a user's physical force.

According to an embodiment, the first state of the electronic device 200 may be referred to as a "first shape", and the second state of the electronic device 200 may be referred to as a "second shape". For example, the first shape may include a normal state, a reduced state, or a closed state, and the second shape may include an open state. According to an embodiment, the electronic device 200 may form a third state (e.g., an intermediate state) located between the first state and the second state. For example, the third state may be referred to as a "third shape", and the third shape may include a free stop state.

According to an embodiment, the display 230 may be visible or viewable from the outside in a front direction (e.g., −z direction) of the electronic device 200 so as to display visual information to the user. For example, the display 230 may include a flexible display. According to an embodiment, the display 230 may be disposed in the second housing 220 and be pull-out from the internal space (not shown) of the electronic device 200 according to the movement of the second housing 220 or may be pulled-in into the internal space of 200 of the electronic device. The internal space of the electronic device 200 may refer to an internal space defined by the first housing 210 and the second housing 220 formed by coupling of the first housing 210 and the second housing 220. For example, in the first state of the electronic device 200, at least a portion of the display 230 may be rolled up to be slid into the internal space of the electronic device 200. When the second housing 220 moves in the first direction while at least a portion of the display 230 is slidingly inserted into the internal space of the electronic device 200, at least a portion of the display 230 may be drawn out from the internal space of the electronic device 200. For another example, when the second housing 220 moves in the second direction, at least a portion of the display 230 may be rolled up into the inside of the electronic device 200 to be inserted into the internal space of the electronic device 200. As at least the portion of the display 230 is slid out or slid out, the display area of the display 230 visible from the outside of the electronic device 200 may be expanded or reduced. According to an embodiment, the display 230 may include a first region 230a and a second region 230b.

According to an embodiment, the first region 230a of the display 230 may fixedly refer to an area of the display 230 that is visible from the outside of the electronic device 200, regardless of whether the electronic device 200 is in the second state or the first state. For example, the first region 230a may indicate a partial area of the display 230 that is not rolled up into the internal space of the electronic device 200. According to an embodiment, as the second housing 220 moves, the first region 230a may move together with the second housing 220. For example, when the second housing 220 moves in the first direction or in the second direction, the first region 230a may be moved along with the second housing 220 on a front surface of the electronic device 200 either in the first direction or in the second direction.

According to an embodiment, the second region 230b of the display 230 may be connected to the first region 230a, and may be slid into the internal space or slid out from the internal space of the electronic device 200 as the second housing 220 moves. For example, the second region 230b of the display 230 may be in a rolled up state, being retracted into the internal space of the electronic device 200, in the first state of the electronic device 200. The second region 230b of the display 230 may not be visible from the outside as it is fully slid into the internal space of the electronic device 200 in the first state of the electronic device 200. As another example, the second region 230b of the display 230 may be in a state drawn out from the internal space of the electronic device 200 in the second state of the electronic device 200. In the second state, the second region 230b of the display 230 may be visible from the outside of the electronic device 200.

According to an embodiment, in the first state of the electronic device 200, the area of the display 230 that is visible from the outside of the electronic device 200 may include only the first region 230a of the display 230. In the second state of the electronic device 200, the area of the display 230 that is visible from the outside of the electronic device 200 may include the first region 230a and at least a portion of the second region 230b of the display 230.

According to an embodiment, the first housing 210 of the electronic device 200 may include a book cover 211 surrounding the internal space of the first housing 210 and a rear plate 212 surrounding a back surface of the book cover 211. The second housing 220 of the electronic device 200 may include a front cover 221 surrounding the internal space of the electronic device 200.

According to an embodiment, the front cover 221 may include a first cover area 221a of the front cover 221 that is not pulled-in into the interior of the first housing 210, and a second cover area 221b that is pulled-in or pull-out into/from the interior of the first housing 210. The first cover area 221a of the front cover 221 may be always visible regardless of whether the electronic device 200 is either in the second state or in the first state. According to an embodiment, at least a portion of the first cover area 221a of the front cover 221 may form a side surface 220a of the second housing 220. According to an embodiment, the second cover area 221b of the second housing 220 may not be visible in the first state, while it may be visible in the second state.

The camera 240 may acquire an image of a subject based on receiving light from the outside of the electronic device 200. According to an embodiment, the camera 240 may include one or more lenses, an image sensor, and/or an image signal processor. According to an embodiment, the camera 240 may be disposed on the second housing 220 so that it faces the rear surface of the electronic device 200 opposite to the front surface of the electronic device 200 on which the first region 230a of the display 230 is disposed. For example, the camera 240 may be disposed on the front cover 221 of the second housing 220 and may be visible from the outside of the electronic device 200 through an opening 211a formed in the book cover 211, when the electronic device 200 is in the first state. As another example, the camera 240 may be disposed on the front cover 221 of the second housing 220, and when the electronic device 200 is in the first state, it may be obscured by the book cover 211 and/or the rear plate 212, so that it may not be visible from the outside of the electronic device 200.

According to an embodiment, the camera 240 may include a plurality of cameras. For example, the camera 240 may include a wide-angle camera, an ultra-wide-angle camera, a telephoto camera, a close-up camera, and/or a depth camera. However, the camera 240 is not necessarily limited to including a plurality of cameras, and may include a single camera.

According to an embodiment, the camera 240 may further include a camera (not shown) facing the front surface of the electronic device 200 on which the first region 230a of the display 230 is disposed. When the camera 240 faces the front surface of the electronic device 200, the camera 240 may be an under display camera (UDC) disposed below the display 230 (e.g., in +z direction from the display 230), but the disclosure is not limited thereto.

According to an embodiment, the electronic device 200 may include a sensor module (not shown) and/or a camera module (not shown) disposed underneath the display 230. The sensor module may detect an external environment based on information (e.g., light) received through the display 230. According to an embodiment, the sensor module may include at least one of a receiver, a proximity sensor, an ultrasonic sensor, a gesture sensor, a gyro sensor, a barometric pressure sensor, a magnetic sensor, an acceleration sensor, a grip sensor, a color sensor, an IR (infrared) sensor, a biometric sensor, a temperature sensor, a humidity sensor, a motor encoder or an indicator. According to an embodiment, at least some sensor modules of the electronic device 200 may be visually exposed to the outside through a partial area of the display 230. According to an embodiment, the electronic device 200 may detect a pull-out length (e.g., a length A) using a sensor module. According to an embodiment, the electronic device 200 may generate information on the pull-out length detected by the sensor. For example, the electronic device 200 may detect and/or identify the degree of pulling-out of the second housing 220 using the pull-out information. According to an embodiment, the pull-out information may include information on the pull-out length of the second housing 220.

According to an embodiment, such a shape of coupling of the first housing 210 and the second housing 220 is not limited to the shape of coupling illustrated in FIGS. 2A, 2B, 2C and 2D, and it may be implemented by a combination and/or coupling of other shapes or parts.

Figure 3A:
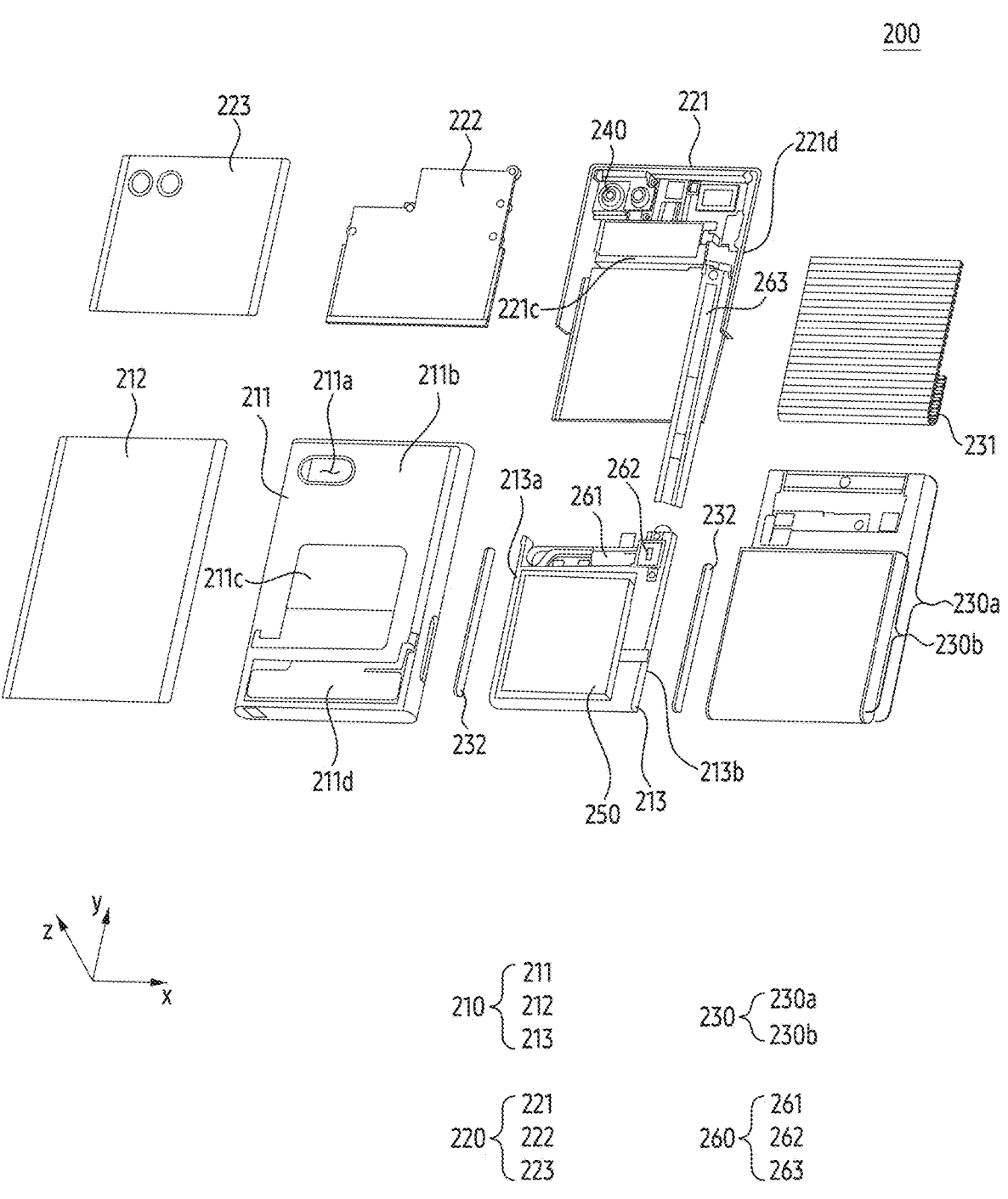
FIG. 3A is an exploded perspective view of an electronic device according to an embodiment.
Figure 3B:
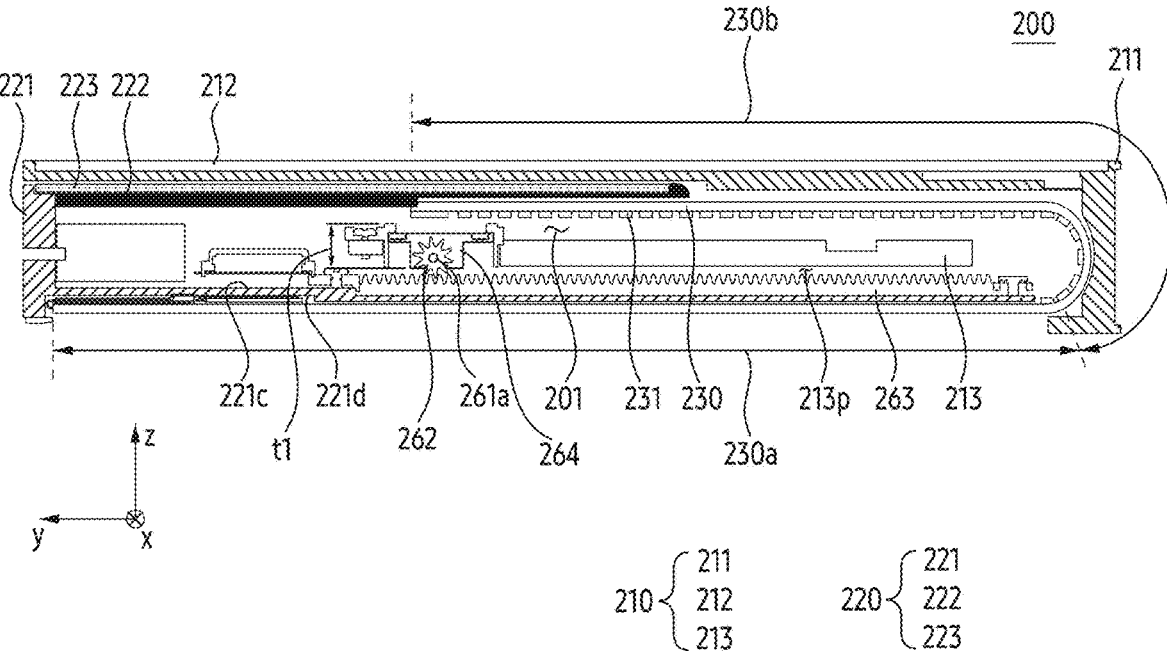
FIG. 3B is a cross-sectional view illustrating an example of an electronic device according to an embodiment taken along a line A-A' of FIG. 2A.

FIG. 3A is an exploded perspective view of an electronic device according to an embodiment, and FIG. 3B is a cross-sectional view of an electronic device according to an embodiment, taken along a line A-A' of FIG. 2A.

Referring to FIGS. 3A and 3B, according to an embodiment, the electronic device 200 may include a first housing 210, a second housing 220, a display 230, a camera 240, a battery 250 (e.g., the battery 189 of FIG. 1) and a driving module 260. According to an embodiment, the first housing 210 and the second housing 220 may be coupled to each other to form an internal space 201 of the electronic device 200. For example, in the first state of the electronic device 200, the second region 230b of the display 230 may be accommodated in the internal space 201.

According to an embodiment, the first housing 210 may include a book cover 211, a rear plate 212, and a frame cover 213. According to an embodiment, the book cover 211, the rear plate 212 and the frame cover 213 arranged in the first housing 210 may be coupled to each other, so that they does not move together with the second housing 220 as the second housing 220 moves with respect to the first housing 210.

According to an embodiment, the book cover 211 may form at least a portion of an outer surface of the electronic device 200. For example, the book cover 211 may form at least a part of the side surface of the electronic device 200 and at least a part of the rear surface of the electronic device 200. According to an embodiment, the book cover 211 may provide a surface on which the rear plate 212 is seated. The rear plate 212 may be seated on one surface 211b of the book cover 211.

According to an embodiment, the frame cover 213 may be configured to support various components within the electronic device 200. For example, the frame cover 213 may be configured to accommodate at least a portion of the battery 250 and the driving module 260. The battery 250 and the driving module 260 may be accommodated in at least one of a recess or a hole provided in the frame cover 213. According to an embodiment, the frame cover 213 may be surrounded by the book cover 211. For example, in the first state of the electronic device 200, one surface 213a of the frame cover 213 on which the battery 250 is disposed may be arranged to face the book cover 211 and/or the second region 230b of the display 230. As another example, in the first state of the electronic device 200, the other surface 213b of the frame cover 213 facing the one surface 213a of the frame cover 213 may be arranged to face the first region 230a of the display 230 or the front cover 221. For example, the frame cover 213 may include an aluminum material, but is not limited thereto.

According to an embodiment, the second housing 220 may include a front cover 221, a rear cover 222 and a slide cover 223. According to an embodiment, the front cover 221, the rear cover 222 and the slide cover 223 may be coupled to each other, and when the second housing 220 moves relative to the first housing 210, it may also move together with the second housing 220. The front cover 221 may be configured to support various components within the electronic device 200. For example, the camera 240 may be disposed on one surface 221c of the front cover 221 facing the internal space 201. The other surface 221d of the front cover 221 facing the one surface 221c of the front cover 221 may be arranged to face the first region 230a of the display 230, when the electronic device 200 is in the first state. According to an embodiment, the rear cover 222 may be coupled to the front cover 221 to protect various components in the electronic device 200 disposed on the front cover 221. For example, the rear cover 222 may cover a portion of one surface 221c of the front cover 221. According to an embodiment, the slide cover 223 may be disposed on the rear cover 222 to form an outer surface of the electronic device 200 together with the rear plate 212 and the book cover 211. The slide cover 223 may be coupled to one surface of the rear cover 222 to protect the rear cover 222 and/or the front cover 221.

According to an embodiment, when the electronic device 200 is in the first state, at least a part of the display 230 may be rolled up into the internal space 201, thereby making it to be bent. According to an embodiment, the display 230 may cover at least a portion of the frame cover 213 and at least a portion of the front cover 221. For example, when the electronic device 200 is in the first state, the display 230 may be configured to cover the other surface 221d of the front cover 221 and pass between the front cover 221 and the book cover 211 to be extended toward the internal space 201. When the electronic device 200 is in the first state, the display 230 may pass between the front cover 221 and the book cover 211 and surround the frame cover 213 disposed in the internal space 201. The display 230 may cover one surface 213a of the frame cover 213 in the internal space 201. According to an embodiment, when the second housing 220 moves in the first direction, the second region 230b of the display 230 may be pulled-out from the internal space 201. For example, as the second housing 220 moves in the first direction, the display 230 may pass between the front cover 221 and the book cover 211 and may be pulled-out from the internal space 201.

According to an embodiment, the first region 230a of the display 230 may be in contact with the other surface 221d of the front cover 221. For example, the first region 230a may extend parallel to the other surface 221d of the front cover 221 while coming into contact with the other surface 221d of the front cover 221. Due to extending parallel to the other surface 221d of the front cover 221, the first region 230a may have a substantially planar shape. According to an embodiment, the first region 230a of the display 230 may not be deformed according to movement of the second housing 220. For example, the first region 230a may move along the movement of the second housing 220 while keeping such a planar shape.

According to an embodiment, the second region 230b of the display 230 may be deformable according to the movement of the second housing 220. For example, when the electronic device 200 is in the first state, the second region 230b may be bent with a certain curvature in the internal space 201 of the electronic device 200. When the second housing 220 moves in the first direction (e.g., +y direction), at least a portion of the second region 230b may be pulled-out from the internal space 201 of the electronic device 200 to be parallel to the other surface 221d of the front cover 221. When at least a portion of the second region 230b is parallel to the other surface 221d of the front cover 221, at least a portion of the second region 230b may have no curvature and have a planar shape. As another example, when the second housing 220 moves in the second direction (e.g., −y direction), the at least a portion of the second region 230b may be slid into the internal space 201 of the electronic device 200. The at least a portion of the second region 230b may be rolled up to be bent with a certain curvature while being pulled-in into the internal space 201 of the electronic device 200.

According to an embodiment, the electronic device 200 may include a support member 231 supporting the display 230 and a guide rail 232. The support member 231 may include a plurality of bars coupled to each other, and may be manufactured in a shape corresponding to the shape of the second region 230b of the display 230. Each of the plurality of bars may support the display 230. For example, the support member 231 may include a plurality of bars extending in a third direction (e.g., +x direction) perpendicular to a first direction (e.g., a +y direction). The support member 231 may be disposed on the second region 230b of the display 230. According to an embodiment, the support member 231 may move along with the display 230 as the display 230 moves. According to an embodiment, in the first state that the second region 230b of the display 230 is rolled up within the internal space 201, the support member 231 may be rolled up inside the internal space 201 together with the second region 230b of the display 230. According to an embodiment, each of the plurality of bars of the support member 231 may be spaced apart from each other. For example, each of the plurality of bars may be spaced apart from each other along the moving direction of the display 230.

According to an embodiment, the guide rail 232 may be configured to guide the movement of the support member 231. For example, as the display 230 moves, the support member 231 may move along the guide rail 232 coupled to the frame cover 213. According to an embodiment, the guide rail 232 may include a plurality of guide rails 232 that are arranged spaced apart from each other at both edges of the frame cover 213 being spaced apart from each other in the third direction (e.g., +x direction) perpendicular to the first direction.

According to an embodiment, the driving module 260 may provide a driving force to the second housing 220 so that the second housing 220 can move relative to the first housing 210. According to an embodiment, the driving module 260 may include a motor 261, a pinion gear 262, a rack gear 263 and a bracket 264. The motor 261 may receive power from the battery 250 to provide the driving force to the second housing 220. According to an embodiment, the motor 261 may be disposed in the first housing 210 and, when the second housing 220 moves with respect to the first housing 210, it may not move together with the second housing 220. For example, the motor 261 may be disposed in a recess formed in the frame cover 213. According to an embodiment, the pinion gear 262 may be coupled to the motor 261 and rotate by a driving force provided from the motor 261. For example, the pinion gear 262 may be rotatably coupled to a shaft 261a that is a drive shaft of the motor 261, and may be rotatable with respect to the motor 261. According to an embodiment, the rack gear 263 may be meshed with the pinion gear 262 and move according to the rotation of the pinion gear 262. For example, the rack gear 263 may linearly reciprocate in either the first direction or the second direction according to the rotation of the pinion gear 262. According to an embodiment, the rack gear 263 may be disposed in the second housing 220. For example, the rack gear 263 may be coupled to the front cover 221 included in the second housing 220. According to an embodiment, the rack gear 263 may be movable within an operating space 213p formed in the frame cover 213. According to an embodiment, the bracket 264 may maintain a position of the pinion gear 262 so that the driving force of the motor 261 can be seamlessly transmitted to the rack gear 263.

According to an embodiment, when the pinion gear 262 rotates along the first rotational direction (e.g., clockwise in FIG. 4B), the rack gear 263 may move in the first direction (e.g., +y direction). When the rack gear 263 moves in the first direction, the second housing 220 coupled to the rack gear 263 may move in the first direction. As the second housing 220 moves in the first direction, the area of the display 230 that is visible from the outside of the electronic device 200 may be expanded. When the pinion gear 262 rotates in the second rotational direction (e.g., counterclockwise in FIG. 4B), the rack gear 263 may move in the second direction (e.g., −y direction). When the rack gear 263 moves in the second direction, the second housing 220 coupled to the rack gear 263 may also move in the second direction. As the second housing 220 moves in the second direction, the area of the display 230 that is visible from the outside of the electronic device 200 may be reduced.

In the above description, it has been described that the motor 261 and the pinion gear 262 are disposed in the first housing 210, and the rack gear 263 is disposed in the second housing 220, but the present disclosure is not limited thereto.

According to other embodiments, the motor 261 and the pinion gear 262 may be disposed in the second housing 220, and the rack gear 263 may be disposed in the first housing 210.

For example, when the pinion gear 262 meshes with the rack gear 263 on the rack gear 263, the thickness of the electronic device 200 adjacent to the driving module 260 (e.g., a length in z-axis direction) may include the thickness of the rack gear 263 and the diameter of the pinion gear 262. In case of increasing the size of the pinion gear 262 to increase the magnitude of the driving force transmitted to the second housing 220, the thickness of the electronic device 200 adjacent to the driving module 260 may increase. When the size of the pinion gear 262 increases, the thickness t1 of the bracket 264 for maintaining engagement between the pinion gear 262 and the rack gear 263 may also increase, so that the thickness of the electronic device 200 adjacent to the drive unit 260 may increase. As described above, when the size of the pinion gear 262 is increased to increase the driving force, the thickness of the electronic device 200 may also increase, so that the electronic device 200 may need a structure to optimize the arrangement of the driving module 260. Hereinafter, a detailed description will be made of the electronic device 200 with the structure for optimizing the arrangement of the driving module 260 for driving the second housing 220.

Figure 4A:
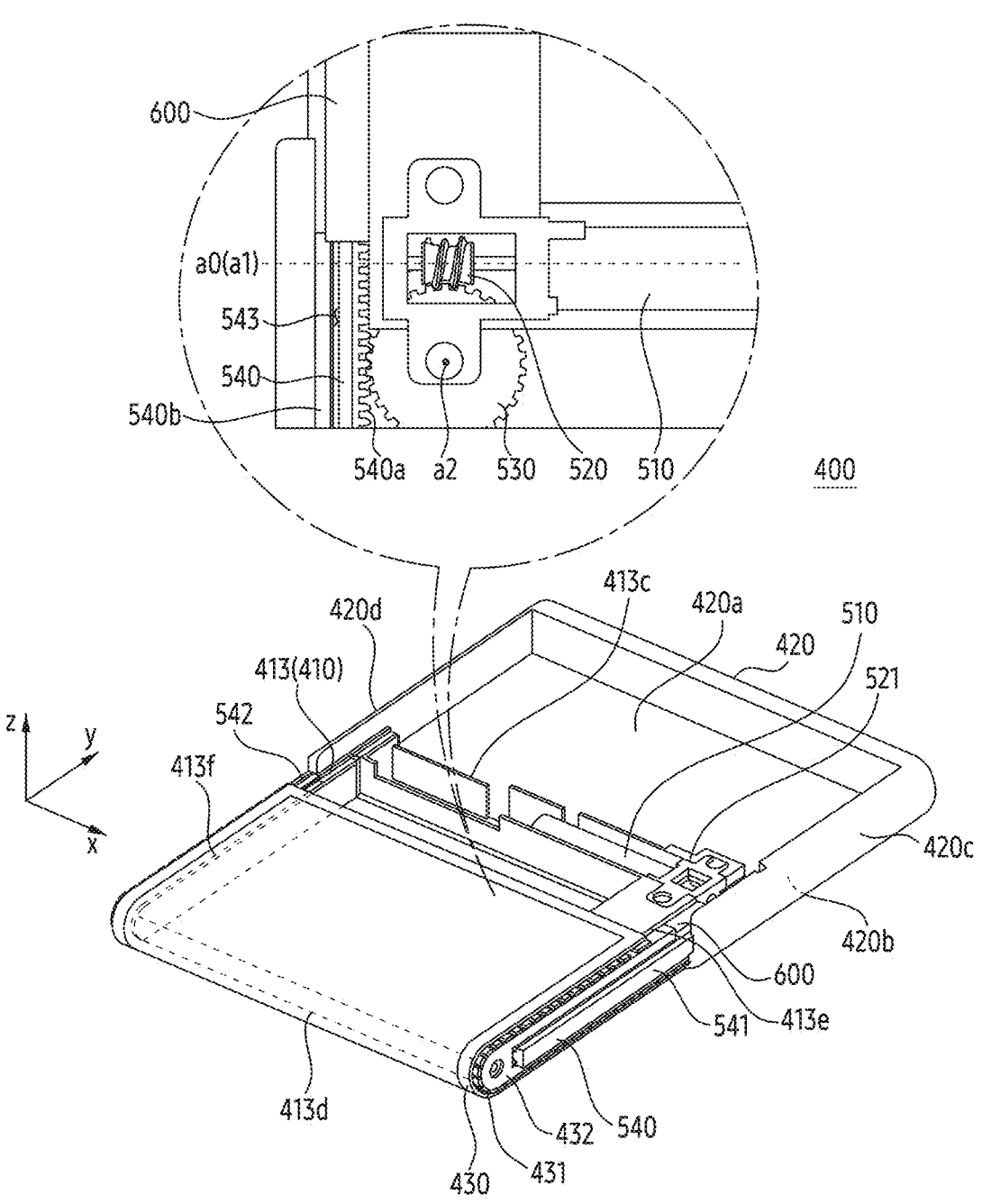
FIG. 4A is a perspective view illustrating a first state of an electronic device according to an embodiment.
Figure 4B:
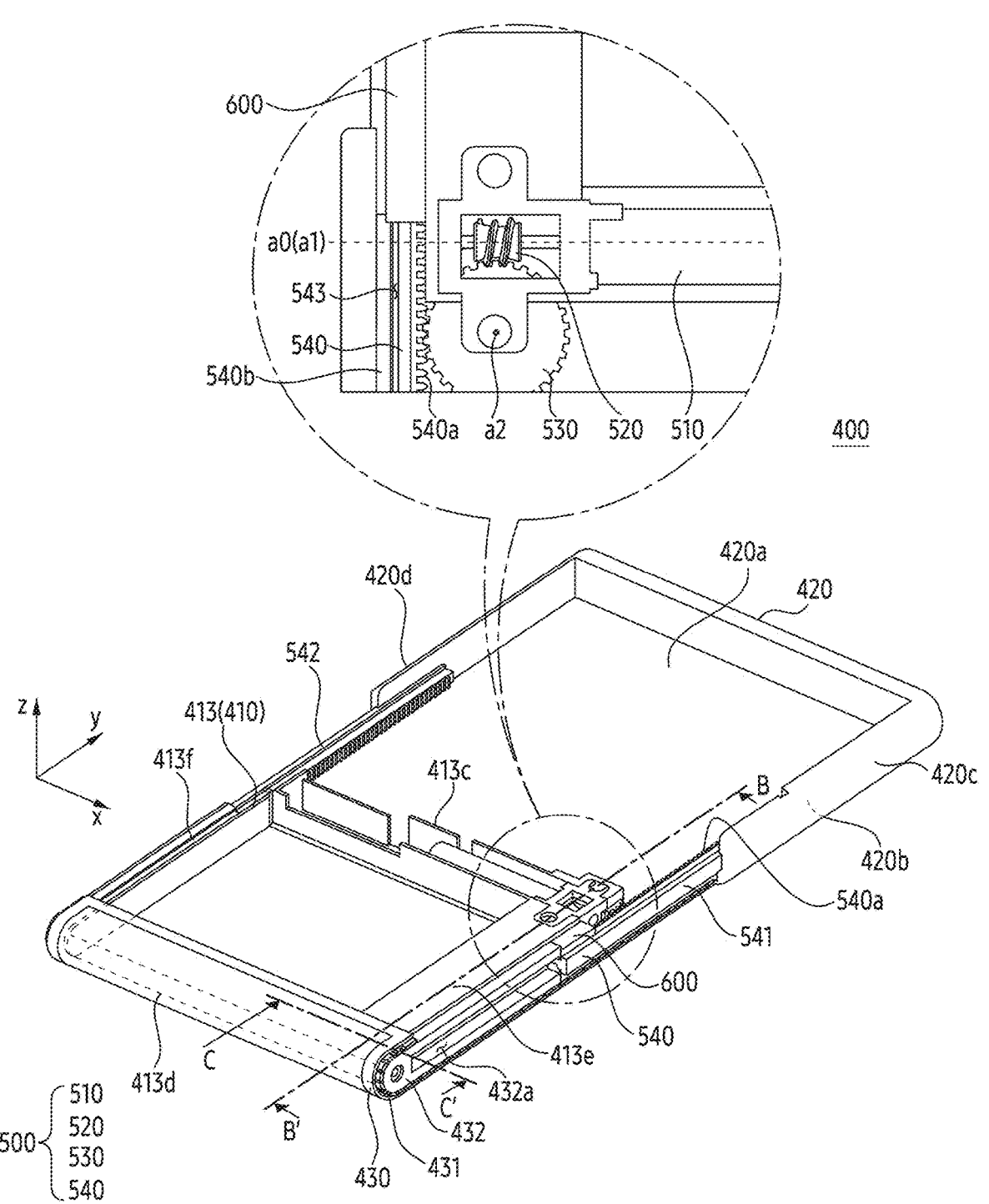
FIG. 4B is a perspective view illustrating a second state of an electronic device according to an embodiment.
Figure 4C:
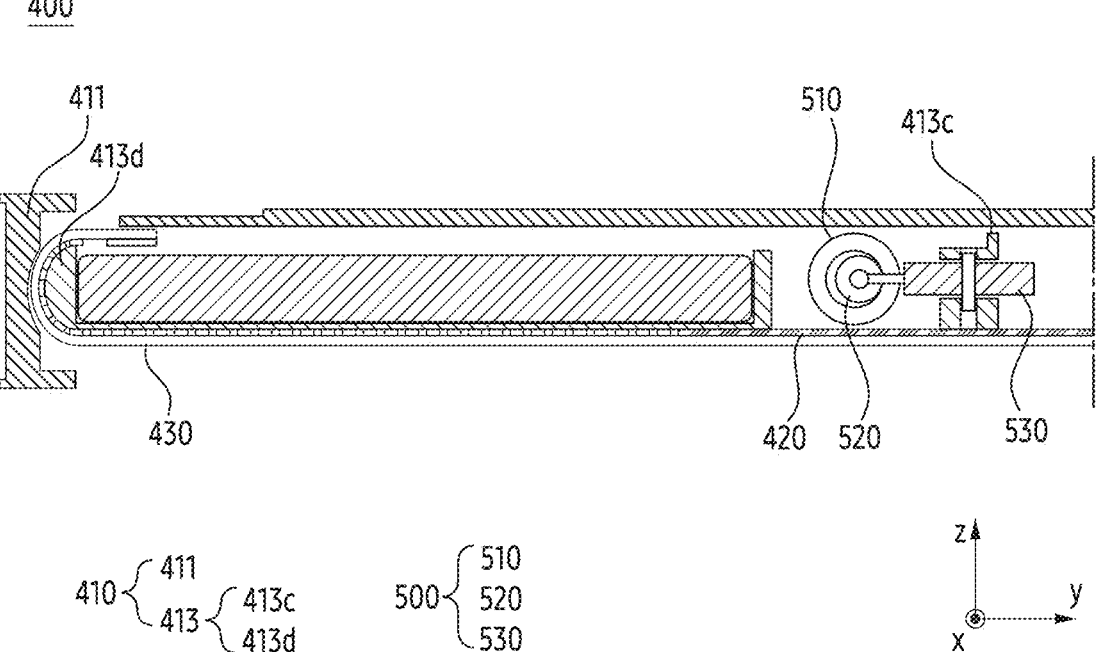
FIG. 4C is a cross-sectional view illustrating an example of an electronic device according to an embodiment taken along a line B-B' of FIG. 4B.

FIG. 4A is a perspective view of the first state of the electronic device according to an embodiment, FIG. 4B is a perspective view of the second state of the electronic device according to an embodiment, and FIG. 4C is a cross-sectional view of an example of the electronic device according to an embodiment taken along a line B-B' of FIG. 4B.

Referring to FIGS. 4A, 4B and 4C, an electronic device 400 (e.g., the electronic device 101 of FIG. 1 and/or the electronic device 200 of FIGS. 3A and 3B) according to an embodiment may include a first housing 410, a second housing 420, a display 430, a support member 431, a guide rail 432, a driving module 500, and at least one first guide member 600. The first housing 410, the second housing 420, the display 430, the support member 431, and the guide rail 432 of FIGS. 4A and 4B may be substantially the same as the first housing 210, the second housing 220, the display 230, the support member 231, and the guide rail 232 of FIGS. 3A and 3B, respectively, so any overlapping descriptions will be omitted.

According to an embodiment, the second housing 420 may be coupled to the first housing 410 so as to be movable with respect to the first housing 410. For example, the second housing 420 may move either in the first direction (e.g., +y direction) with respect to the first housing 410 or in the second direction opposite to the first direction (e.g., −y direction). The first direction may be a direction in which the area of the display 430 viewable from the outside of the electronic device 400 expands according to the movement of the second housing 420. The second direction may be a direction in which the area of the display 430 viewable from the outside of the electronic device 400 contracts according to the movement of the second housing 420.

According to an embodiment, the state of the electronic device 400 may include a first state in which the second housing 420 is movable in the first direction of the first direction and the second direction, and a second state in which the second housing 420 is movable in the second direction of the first direction and the second direction. For example, when the electronic device 400 is in the first state, the second housing 420 may be movable only in the first direction and may not be movable in the second direction. As another example, when the electronic device 400 is in the second state, the second housing 420 may be movable only in the second direction and may not be movable in the first direction.

According to an embodiment, the first housing 410 may include a book cover 411 and a frame cover 413. The book cover 411 may form at least a portion of an outer surface of the electronic device 400. The book cover 411 of FIG. 4C may be substantially the same as the book cover 211 of FIGS. 3A and/or 3B, and thus an overlapping and redundant description will be omitted.

The frame cover 413 may support at least a portion of the driving module 500. According to an embodiment, the frame cover 413 may include a first periphery 413*c* facing a first direction, and a second periphery 413*d* facing the first periphery 413*c* and facing the second direction opposite to the first direction. According to an embodiment, the frame cover 413 may include a third periphery 413*e* that is substantially perpendicular to the first periphery 413*c*, and a fourth periphery 413*f* that is substantially perpendicular to the third periphery 413*e* and facing the seat 413*e*. Here, the term 'periphery' may refer to one region of several regions defined by one element, including a boundary to distinguish the one element from other elements, and the wording may be also used in the same manner in the following description, unless otherwise mentioned therein. For example, the first periphery 413*c* may include a boundary of the frame cover 413 facing the first direction. The second periphery 413*d* may be spaced apart from the first periphery 413*c* in the second direction, and may include a boundary of the frame cover 413 facing the second direction. The third periphery 413*e* may extend from one end of the second periphery 413*d* to one end of the first periphery 413*c* along the first direction. The fourth periphery 413*f* may extend from the other end of the second periphery 413*d* to the other end of the first periphery 413*c* in the first direction. The fourth periphery 413*f* may be spaced apart from the third periphery 413*e*, facing the third periphery 413*e*.

According to an embodiment, the second housing 420 may be movable with respect to the frame cover 413, using the driving force from the driving module 500. According to an embodiment, one or more electronic components (e.g., the processor 120 of FIG. 1) for implementing various functions of the electronic device 400 may be disposed on one surface 420*a* of the second housing 420. At least a portion of the display 430 may be disposed on the other surface 420*b* of the second housing 420 facing the one surface 420*a* of the second housing 420.

According to an embodiment, the display 430 may expand or contract according to the movement of the second housing 420. For example, when the second housing 420 moves in the first direction, the area of the display 430 that is viewable from the outside of the electronic device 400 may be expanded. As another example, when the second housing 420 moves in a second direction opposite to the first direction, the area of the display 430 that is viewable from the outside of the electronic device 400 may be reduced.

According to an embodiment, the support member 431 (e.g., the support member 231 of FIGS. 3A and 3B) may be disposed on a portion of the display 430. For example, the support member 431 may include a plurality of bars extending in a third direction (e.g., +x direction) perpendicular to the first direction. The plurality of bars of the support member 431 may be connected to each other. As the plurality of bars are connected to each other, the shape of the support member 431 may correspond to the shape of a portion of the display 430. According to an embodiment, when the second housing 420 moves with respect to the first housing 410, the support member 431 may be movable on the frame cover 413 according to the movement of the second housing 420.

According to an embodiment, the guide rail 432 (e.g., the guide rail 232 of FIGS. 3A and 3B) may guide the movement of the support member 431. According to an embodiment, the guide rail 432 may be arranged at both peripheries of the frame cover 413 that are spaced apart from each other in the third direction (e.g., +x direction) perpendicular to the first direction. For example, the guide rail 432 may include a plurality of guide rails 432 disposed on the third periphery 413*e* and the fourth periphery 413*f*, respectively. According to an embodiment, the guide rail 432 may include an operating space 432*a* for accommodating at least a portion of the driving module 500. The operating space 432*a* may extend from one end of the guide rail 432 facing the first periphery 413*c* toward the second periphery 413*d*. For example, the operating space 432*a* may extend from a portion of the guide rail 432 facing the second periphery 413*d* to another portion of the guide rail 432 facing the first periphery 413*c* in the first direction. One end of the guide rail 432 may have an open surface facing the first direction to be connected to the operating space 432*a*. Through the open surface of the guide rail 432, at least a portion of the rack gear 540 may move within the operating space 432*a*.

According to an embodiment, the driving module 500 may include a motor 510, a driving gear 520, at least one transmission gear 530, and a rack gear 540. The motor 510 may be disposed in the first housing 410 to provide a driving force to the second housing 420. For example, the motor 510 may provide the driving force to the second housing 420 based on receiving power from a battery (e.g., the battery 189 of FIG. 1). According to an embodiment, the motor 510 may be disposed on the first periphery 413*c* of the frame cover 413. For example, the motor 510 may be disposed in a recess or hole formed in the first periphery 413*c* of the frame cover 413. According to an embodiment, the driving shaft a0 of the motor 510 may be parallel to a direction perpendicular to the first direction (e.g., +x direction and/or −x direction). For example, the driving shaft a0 of the motor 510 may be perpendicular to a direction (e.g., −z direction) the other surface 420*b* of the second housing 420 on which the display 430 is disposed faces.

The driving gear 520 may transmit the driving force of the motor 510 to the transmission gear 530. According to an embodiment, the driving gear 520 may be rotatably coupled to the motor 510. For example, a direction of the first rotation shaft a1 of the driving gear 520 may be substantially the same as the direction of the driving shaft a0 of the motor 510. The first rotation shaft a1 of the driving gear 520 may be substantially coaxial with the driving shaft a0 of the motor 510. For example, the driving gear 520 may include at least one of a worm gear, a bevel gear or a screw gear, but is not limited thereto. The worm gear may be, for example, a cylindrical worm gear or a globoid worm gear, but is not limited thereto.

According to an embodiment, the driving module 500 may include a bracket 521 for supporting the driving gear 520. The bracket 521 may maintain meshing between the driving gear 520 and the transmission gear 530. According to an embodiment, the bracket 521 may be coupled to the first periphery 413*c* of the frame cover 413. For example, the bracket 521 may be coupled to the frame cover 413 through a coupling member (e.g., a screw), but is not limited thereto.

At least one transmission gear 530 may transmit the driving force transmitted from the driving gear 520 to the rack gear 540. According to an embodiment, the at least one transmission gear 530 may be engaged with the driving gear 520 to be rotatable according to the rotation of the driving gear 520. For example, as the driving gear 520 rotates, the transmission gear 530 may rotate about the second rotation axis a2 that is perpendicular to the first rotation axis a1 of the driving gear 520 (e.g., in +z direction and/or in –z direction). The second rotation axis a2 may be parallel to a direction the other surface 420b of the second housing 420 on which the display 430 is disposed faces. According to an embodiment, the transmission gear 530 may be disposed on the first periphery 413c of the frame cover 413 so as to be rotatable with respect to the frame cover 413. As the transmission gear 530 is coupled to the frame cover 413, the transmission gear 530 may not move together with the second housing 420 and be rotatable with respect to the frame cover 413, when the second housing 420 moves with respect to the first housing 410. For example, the transmission gear 530 may be coupled to the frame cover 413 by a coupling member configured to couple the bracket 521 to the frame cover 413, but it is not limited thereto. According to an embodiment, the number of transmission gears 530 may be different from that of driving gears 520. For example, the transmission gear 530 may include at least one of a worm wheel gear, a bevel gear, a screw gear and a pinion gear, but it is not limited thereto.

The rack gear 540 may receive a driving force from the transmission gear 530 to move the second housing 420. According to an embodiment, at least a portion of the rack gear 540 may be engaged with the transmission gear 530 to move according to the rotation of the at least one transmission gear 530. The rack gear 540 may be disposed in the second housing 420. As the rack gear 540 is disposed in the second housing 420, the rack gear 540 may move together with the second housing 420 either in the first direction or in the second direction opposite to the first direction with respect to the first housing 410, when the transmission gear 530 rotates. According to an embodiment, the rack gear 540 may have a shape extending in the second direction from one surface 420a of the second housing 420.

According to an embodiment, the rack gear 540 may include a gear surface 540a. The gear surface 540a may include a plurality of teeth that mesh with at least one transmission gear 530. According to an embodiment, the gear surface 540a may face the direction (e.g., –x direction) perpendicular to the direction (e.g., –z direction) in which the other surface 420b of the second housing 420 on which the display 430 is disposed faces. For example, the direction which the gear surface 540a faces may be parallel to the first rotation axis a1 of the driving gear 520 and perpendicular to the second rotation axis a2 of the transmission gear 530. According to an embodiment, the rack gear 540 may be spaced apart from the driving gear 520 when the first housing 410 is viewed from above (e.g., in +z direction). The rack gear 540 may not overlap the driving gear 520 when the first housing 410 is viewed from above. For example, when the transmission gear 530 is omitted, the rack gear 540 may be arranged so that the gear surface 540a of the rack gear 540 may be parallel to the direction which one surface 420a of the second housing 420 faces, and the driving gear 520 may be disposed on the rack gear 540 to mesh with the rack gear 540. In case that the driving gear 520 is disposed on the rack gear 540, the thickness of the electronic device 400 adjacent to the driving module 500 (e.g., the length in z-axis direction) may be larger than when the driving gear 520 does not overlap the rack gear 540.

According to an embodiment, the electronic device 400 may provide a structure in which the rack gear 540 and the driving gear 520 do not overlap, owing to the rack gear 540 arranged so that the gear surface 540a faces a direction perpendicular to the direction which the other surface 420b of the second housing 420 faces. The electronic device 400 may provide a structure capable of reducing the thickness of the electronic device 400 since the rack gear 540 and the driving gear 520 do not overlap each other. Since the rack gear 540 and the driving gear 520 do not overlap each other, the bracket 521 and the rack gear 540 that maintain the position of the driving gear 520 do not also overlap each other, and thus, the electronic device 400 according to this embodiment may provide such a structure capable of reducing the thickness of the electronic device 400. According to an embodiment, the electronic device 400 may secure a space for arranging an enlarged size of the driving gear 520, with the rack gear 540 that does not overlap the driving gear 520, thereby providing the structure for securing a driving force for moving the second housing 420 in a smooth and seamless manner.

According to an embodiment, the rack gear 540 may include a first rack gear 541 and a second rack gear 542 disposed on different peripheries 420c and 420d of the second housing 420, respectively. The peripheries 420c and 420d of the second housing 420 in which the first rack gear 541 and the second rack gear 542 are disposed may be spaced apart from each other in a direction perpendicular to the first direction (e.g., +x direction), which is the moving direction of the second housing 420. For example, the first periphery 420c of the second housing 420 may face the third periphery 413e of the frame cover 413, when the electronic device 400 is in the first state. The first periphery 420c of the second housing 420 may face a direction perpendicular to the first direction (e.g., +x direction), and may face the driving gear 520, when the electronic device 400 is in the first state. The second periphery 420d of the second housing 420 may be perpendicular to the first direction and may face a direction (e.g., –x direction) opposite to the direction which the first periphery 420c faces. According to an embodiment, the first rack gear 541 may be disposed on the first periphery 420c of the second housing 420. The second rack gear 542 may be disposed on the second periphery 420d of the second housing 420.

Although the electronic device 400 is illustrated as having both the first rack gear 541 and the second rack gear 542 in FIGS. 4A and 4B, this is only for convenience of description. According to embodiments, the structure of the electronic device 400 related to the first rack gear 541 and the second rack gear 542 may be changed variously. For example, the electronic device 400 may include only the first rack gear 541. As another example, the electronic device 400 includes the first rack gear 541 and the second rack gear 542, and both the first rack gear 541 and the second rack gear 542 may include a gear surface 540a. As another example, the electronic device 400 may include both the first rack gear 541 and the second rack gear 542, while the second rack gear 542 may not include the gear surface 540a.

According to an embodiment, the driving gear 520 may receive a driving force from the motor 510 to rotate about a first rotation axis a1. As the driving gear 520 rotates, the transmission gear 530 meshed with the driving gear 520 may rotate about a second rotation axis a2 perpendicular to the first rotation axis a1. As the transmission gear 530 rotates, the rack gear 540 meshed with the transmission gear 530 may move together with the second housing 420 in the first direction or the second direction opposite to the first direction. When the second housing 420 is moved in the first direction by the rack gear 540, the area of the display 430 viewable from the outside of the electronic device 400 may be enlarged. When the second housing 420 is moved in the second direction by the rack gear 540, the area of the display 430 viewable from the outside of the electronic device 400 may be reduced. According to an embodiment, the operating space 432*a* of the guide rail 432 may provide a space in which the rack gear 540 moves. The rack gear 540 may be pulled-in into the operating space 432*a* of the guide rail 432 or pulled-out from the operating space 432*a* according to the movement of the second housing 420.

According to an embodiment, at least one first guide member 600 may guide the movement of the second housing 420 and/or the rack gear 540. The first guide member 600 may reduce friction generated as the second housing 420 and/or the rack gear 540 move. For example, the first guide member 600 may include a plurality of bearings to guide the movement of the rack gear 540.

According to an embodiment, the first guide member 600 may be coupled to a portion of the frame cover 413 facing the transmission gear 530. For example, the first guide member 600 may be disposed on a part of the third periphery 413*e* of the frame cover 413 facing the transmission gear 530. According to an embodiment, the first guide member 600 may be disposed at both peripheries 413*e* and 413*f* of the frame cover 413 spaced apart from each other, in a direction perpendicular to the moving direction of the second housing 420 (e.g., in +x direction). For example, the first guide members 600 may be disposed on the third periphery 413*e* and the fourth periphery 413*f* of the frame cover 413, respectively, facing each other. According to an embodiment, the first guide member 600 may be disposed on the frame cover 413 so as to come into contact with a portion of the guide rail 432 facing the first direction.

According to an embodiment, the rack gear 540 may include a gear rail 543 disposed on a side surface 540*b* of the rack gear 540 perpendicular to the gear surface 540*a*. The gear rail 543 may guide the movement of the rack gear 540 and the second housing 420. For example, the gear rail 543 may be formed with a portion of the side surface 540*b* of the rack gear 540 being recessed to the inside of the rack gear 540. The gear rail 543 may extend along at least a portion of the side surface 540*b* of the rack gear 540. According to an embodiment, the gear rail 543 may prevent the second housing 420 from being tilted with respect to the first housing 410 together with the first guide member 600. For example, the gear rail 543 and the first guide member 600 may prevent the rack gear 540 from moving in a direction inclined with respect to the first direction or the second direction. With the gear rail 543 and the first guide member 600, the second housing 420 connected to the rack gear 540 may not be tilted with respect to the first housing 410, when it moves with respect to the first housing 410. For example, in case where the motor 510 is disposed to face only the first rack gear 541, the driving force provided from the motor 510 may be unevenly transmitted to the second housing 420. As the driving force is unevenly transmitted to the second housing 420, the second housing 420 may be inclined with respect to the first housing 410. As another example, when the second housing 420 moves with respect to the first housing 410, the second housing 420 may be inclined with respect to the first housing 410 by its own weight (self-loading). When the second housing 420 gets inclined with respect to the first housing 410, it may lead to an increased possibility of damage of the display 430, thereby having the driving force of the motor 510 wasted. According to an embodiment, the electronic device 400 can prevent the second housing 420 from being inclined with respect to the first housing 410, owing to the rack gear 540 guiding the movement of the second housing 420 while moving the second housing 420. Since the electronic device 400 according to an embodiment does not need to have a separate guide part for guiding the second housing 420, it makes it possible to provide an extra space for other components within the electronic device 400.

FIGS. 4A and 4B illustrate that only the first rack gear 541 has the gear rail 543, but it is only for convenience of description. For example, the second rack gear 542 facing the first rack gear 541 may have the gear rail 543 substantially the same as the first rack gear 541.

As described above, the electronic device 400 according to an embodiment can provide the structure capable of reducing the thickness of the electronic device 400, owing to the rack gear 540 in which the gear surface 540*a* is disposed perpendicular to the direction one surface of the second housing 420 faces. The electronic device 400 according to an embodiment can provide the space for other components in the electronic device 400, using the guide rail 432 that provides a moving space of the rack gear 540 while guiding the movement of the support member 431 in contact with the display 430. The electronic device 400 according to an embodiment can provide the structure for efficiently utilizing the driving force of the motor 510 while preventing the second housing 420 from being tilted with respect to the first housing 410, by the first guide member 600 capable of guiding the movement of the second housing 420 and the rack gear 540.

Figure 5:
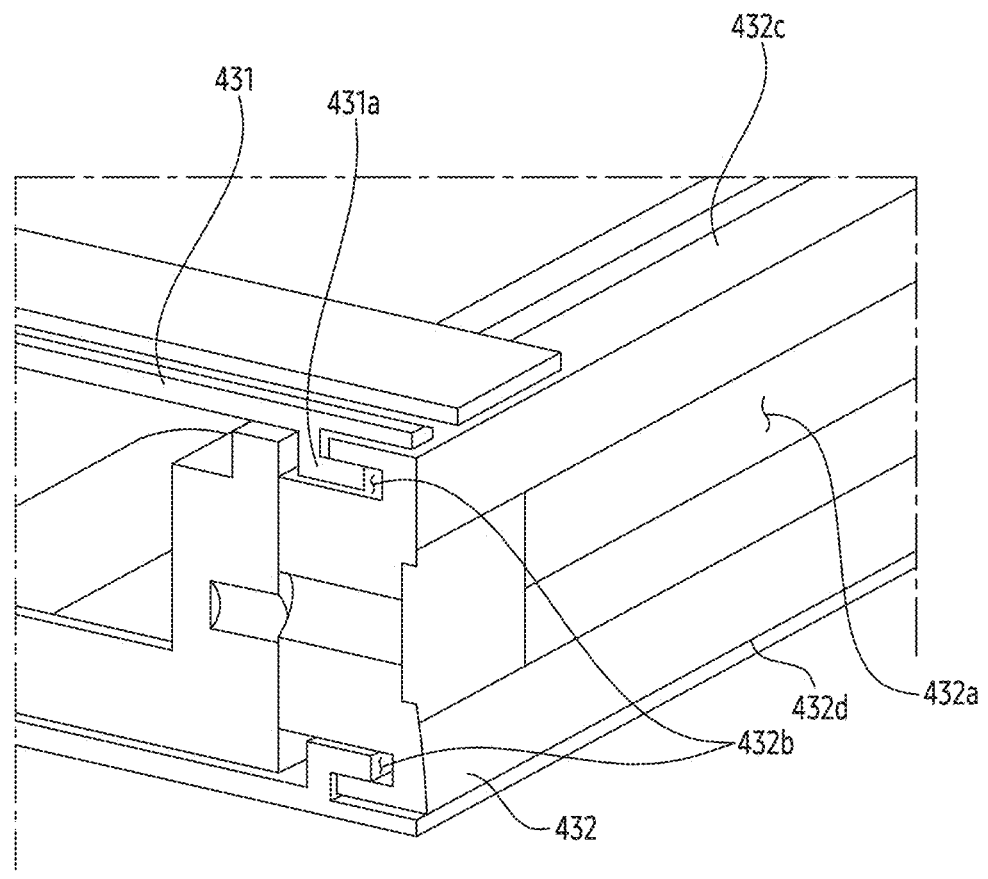
FIG. 5 is a partial cross-sectional view illustrating an example of an electronic device according to an embodiment taken along a line C-C' of FIG. 4B.
Figure 5:
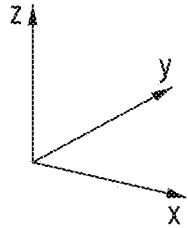

FIG. 5 is a partial cross-sectional view illustrating an example of the electronic device according to an embodiment taken along a line C-C' of FIG. 4B.

Referring to FIG. 5, according to an embodiment, the guide rail 432 may further include a guide groove 432*b* for guiding the movement of the support member 431. For example, the guide groove 432*b* may extend within the guide rail 432 along the first direction (e.g., +y direction) that is a moving direction of the second housing 420. According to an embodiment, the guide groove 432*b* may surround at least a portion of the operating space 432*a* of the guide rail 432. As the second housing (e.g., the second housing 420 of FIGS. 4A and 4B) moves, the support member 431 may move within the guide groove 432*b*. For example, when the second housing 420 moves in the first direction, at least a portion of the support member 431 may move from one surface 432*c* of the guide rail 432 onto the other surface 432*d* of the guide rail 432 facing the one surface 432*c* of the guide rail 432, along the guide groove 432*b*. As another example, when the second housing 420 moves in the second direction (e.g., −y direction) opposite to the first direction, the at least a portion of the support member 431 may move from the other surface 432 *d* of the guide rail 432 to the one surface 432*c* of the guide rail 432, along the guide groove 432*b*.

According to an embodiment, each of the plurality of bars of the support member 431 may include a guide projection 431*a* that is movable within the guide groove 432*b* according to the movement of the second housing 420. For example, at least a portion of the guide projection 431*a* may be inserted into the guide groove 431*b* to be movable within the guide groove 431*b* according to the movement of the second housing 420. According to an embodiment, each of the plurality of bars of the support member 431 may be spaced apart from each other. For example, each of the plurality of bars may be spaced apart from each other along the moving direction of the display 430.

As described above, the electronic device (e.g., the electronic device 400 of FIGS. 4A and 4B) according to an embodiment can provide a space for other components in the electronic device 400, owing to the guide rail 432 providing a moving space for the rack gear 540 while guiding the movement of the support member 431 in contact with the display (the display 430 of FIGS. 4A and 4B).

Figure 6:
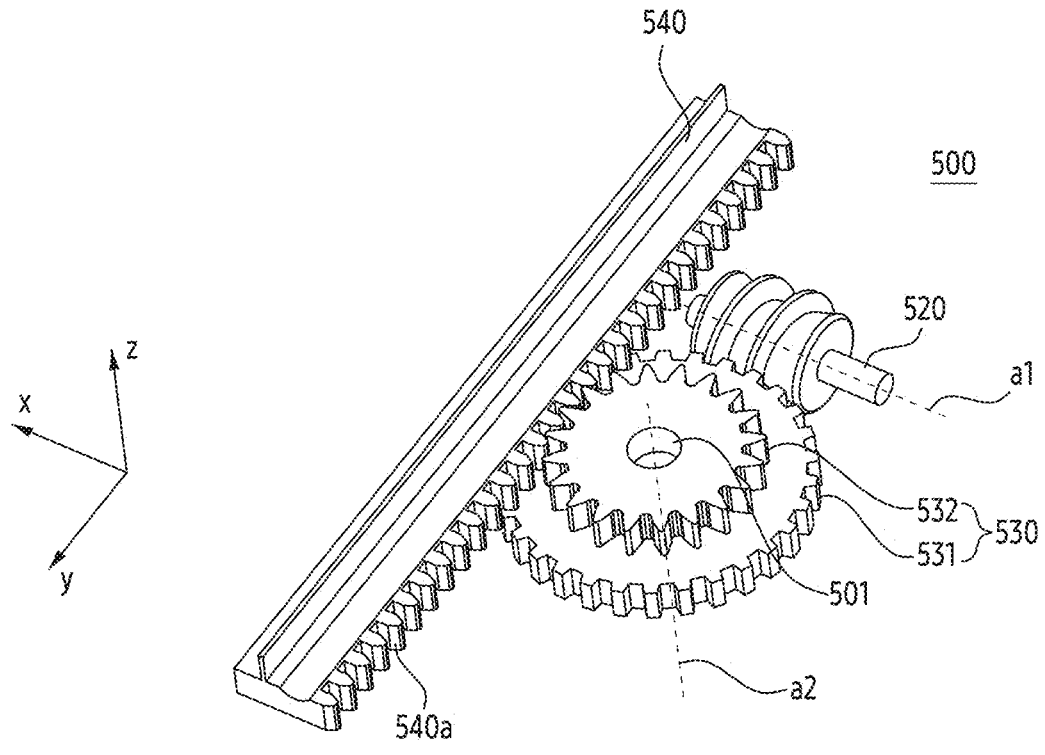
FIG. 6 is a diagram illustrating an example of a driving module of an electronic device according to an embodiment.

FIG. 6 is a diagram illustrating an example of a driving module of an electronic device according to an embodiment.

Referring to FIG. 6, at least one transmission gear 530 of the driving module 500 according to an embodiment may include a first gear 531 meshed with the driving gear 520 and a second gear 532 disposed on the first gear 531. At least a portion of the first gear 531 may be engaged with the driving gear 520 and the first gear 531 may rotate according to the rotation of the driving gear 520. For example, the first gear 531 may be engaged with the driving gear 520 to be rotatable about the second rotation axis a2 perpendicular to the first rotation axis a1 of the driving gear 520.

According to an embodiment, the second gear 532 may be coaxial with the first gear 531. For example, the second gear 532 may share the second rotation shaft a2 of the first gear 531. According to an embodiment, the driving module 500 may include a shaft 501 passing through the first gear 531 and the second gear 532. For example, the shaft 501 may extend along a direction parallel to the second rotation axis a2. The second gear 532 may be coupled to the first gear 531 through the shaft 501, so that it can rotate together with the first gear 531, when the first gear 531 rotates by the driving gear 520.

According to an embodiment, the second gear 532 may be engaged with at least some of a plurality of teeth on the gear surface 540a of the rack gear 540 to move the rack gear 540. For example, when the first gear 531 is rotated by the driving gear 520, the second gear 532 may be rotated by the first gear 531. As the second gear 532 rotates by the first gear 531, the rack gear 540 may move along the first direction (e.g., +y direction) or the second direction (e.g., −y direction). For example, the second gear 532 may be a pinion gear, but is not limited thereto.

According to an embodiment, in case that the driving gear 520 is a worm gear, the first gear 531 may be a worm wheel gear, but is not limited thereto. The type of the driving gear 520 and the transmission gear 530 may be variously changed according to various embodiments. For example, the driving gear 520 and the first gear 531 may be bevel gears that are vertically meshed with each other. As another example, the driving gear 520 and the first gear 531 may be screw gears that are vertically meshed with each other.

As apparent from the foregoing, the electronic device (e.g., the electronic device 400 of FIGS. 4A and 4B) according to an embodiment can provide the structure for efficiently transmitting a driving force to the rack gear 540 to move the second housing (e.g., the second housing 420 of FIGS. 4A and 4B), through the first gear 531 and the second gear 532 meshed with the driving gear 520.

Figure 7:
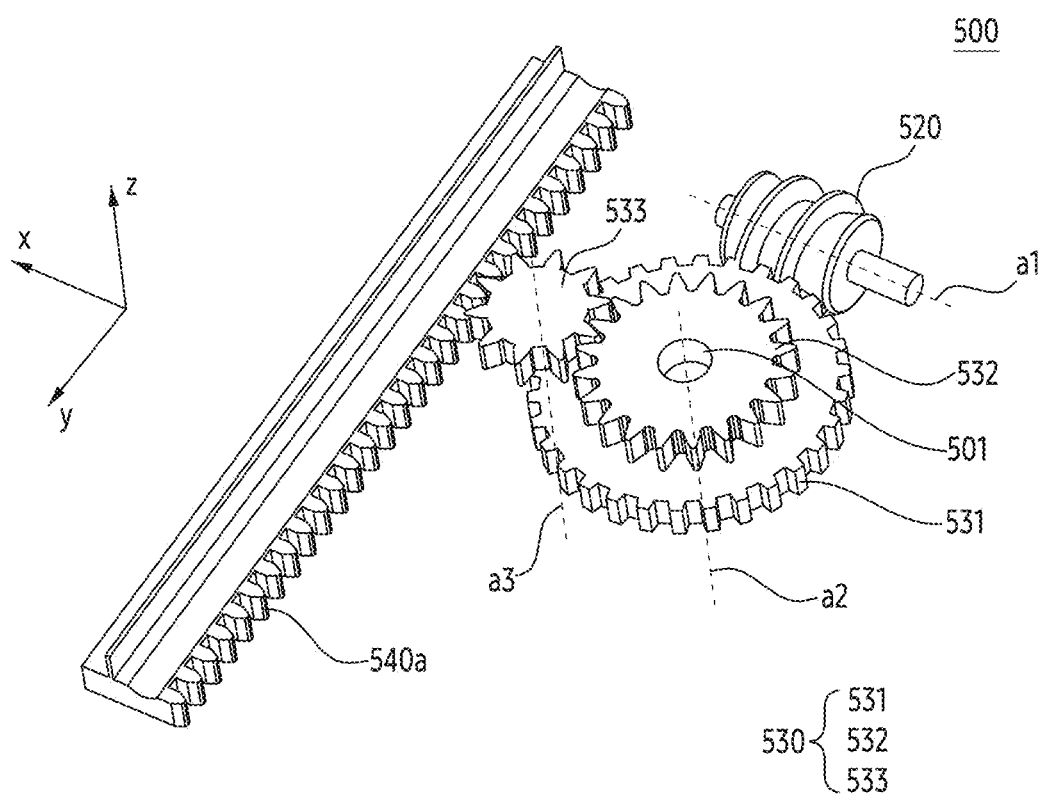
FIG. 7 is a diagram illustrating another example of a driving module of an electronic device according to an embodiment.

FIG. 7 is a diagram illustrating another example of a driving module of an electronic device according to an embodiment.

Referring to FIG. 7, at least one transmission gear 530 of the driving module 500 according to an embodiment may include a first gear 531 meshing with the driving gear 520, a second gear 532 disposed on the first gear 531, and a third gear 533 meshing with the second gear 532 and the rack gear 540.

According to an embodiment, at least a portion of the first gear 531 may be engaged with the driving gear 520 and the first gear 531 may rotate according to the rotation of the driving gear 520. For example, the first gear 531 may be engaged with the driving gear 520 to be rotatable about the second rotation axis a2 perpendicular to the first rotation axis a1 of the driving gear 520.

According to an embodiment, the second gear 532 may be coaxial with the first gear 531. For example, the second gear 532 may share the second rotation shaft a2 of the first gear 531 with the first gear 531. According to an embodiment, the driving module 500 may include a shaft 501 passing through the first gear 531 and the second gear 532. For example, the shaft 501 may extend along a direction parallel to the second rotation axis a2. The second gear 532 may be coupled to the first gear 531 through the shaft 501 so that it rotates together with the first gear 531, when the first gear 531 rotates by the driving gear 520. For example, the second gear 532 may be a pinion gear, but it is not limited thereto.

According to an embodiment, the third gear 533 may mesh with at least some of a plurality of teeth on the gear surface 540a of the second gear 532 and the rack gear 540. The third gear 533 may rotate by the rotation of the second gear 532 to move the rack gear 540. According to an embodiment, the third gear 533 may rotate about a third rotation axis a3 parallel to the second rotation axis a2 of the second gear. For example, when the first gear 531 is rotated by the driving gear 520, the second gear 532 may rotate about the second rotation axis a2. As the second gear 532 rotates, the third gear 533 may rotate about the third rotation axis a3 to move the rack gear 540 in the first direction (e.g., +y direction) or the second direction (e.g., −y direction). For example, the third gear 533 may be a pinion gear, but is not limited thereto.

According to an embodiment, in case where the driving gear 520 is a worm gear, the first gear 531 may be a worm wheel gear, but it is not limited thereto. The type of the driving gear 520 and the transmission gear 530 may change variously according to various embodiments. For example, the driving gear 520 and the first gear 531 may be bevel gears that are vertically meshed with each other. As another example, the driving gear 520 and the first gear 531 may be screw gears that vertically mesh with each other.

As described above, the electronic device (e.g., the electronic device 400 of FIGS. 4A and 4B) according to an embodiment can provide the structure for efficiently transmitting a driving force to the rack gear 540 to move the second housing (e.g., the second housing 420 of FIGS. 4A and 4B), through the first gear 531, the second gear 532 and the third gear 533 meshing with the driving gear 520.

Figure 8A:
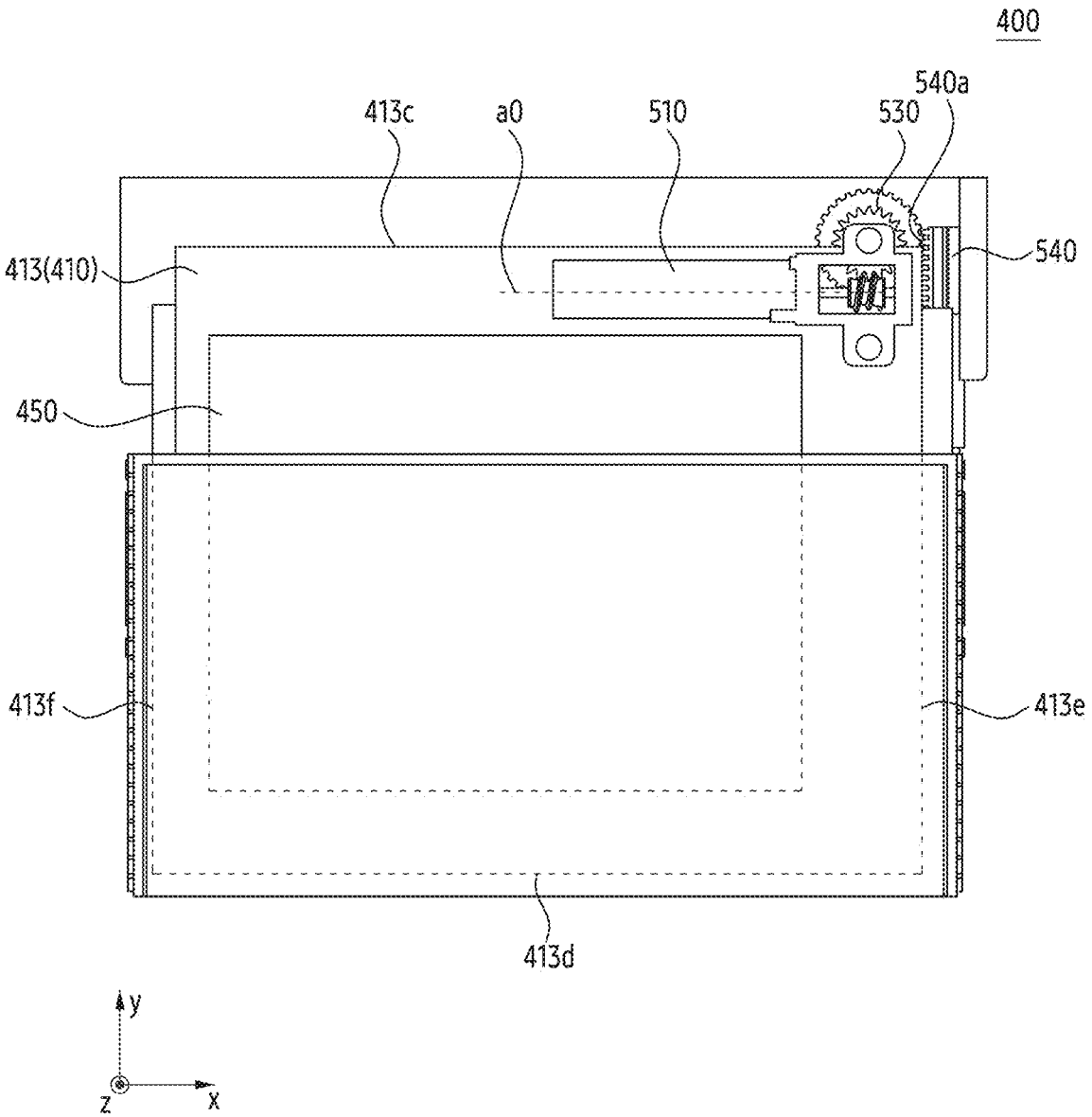
FIG. 8A is a rear view illustrating an example of a second housing and a driving module of an electronic device according to an embodiment.
Figure 8B:
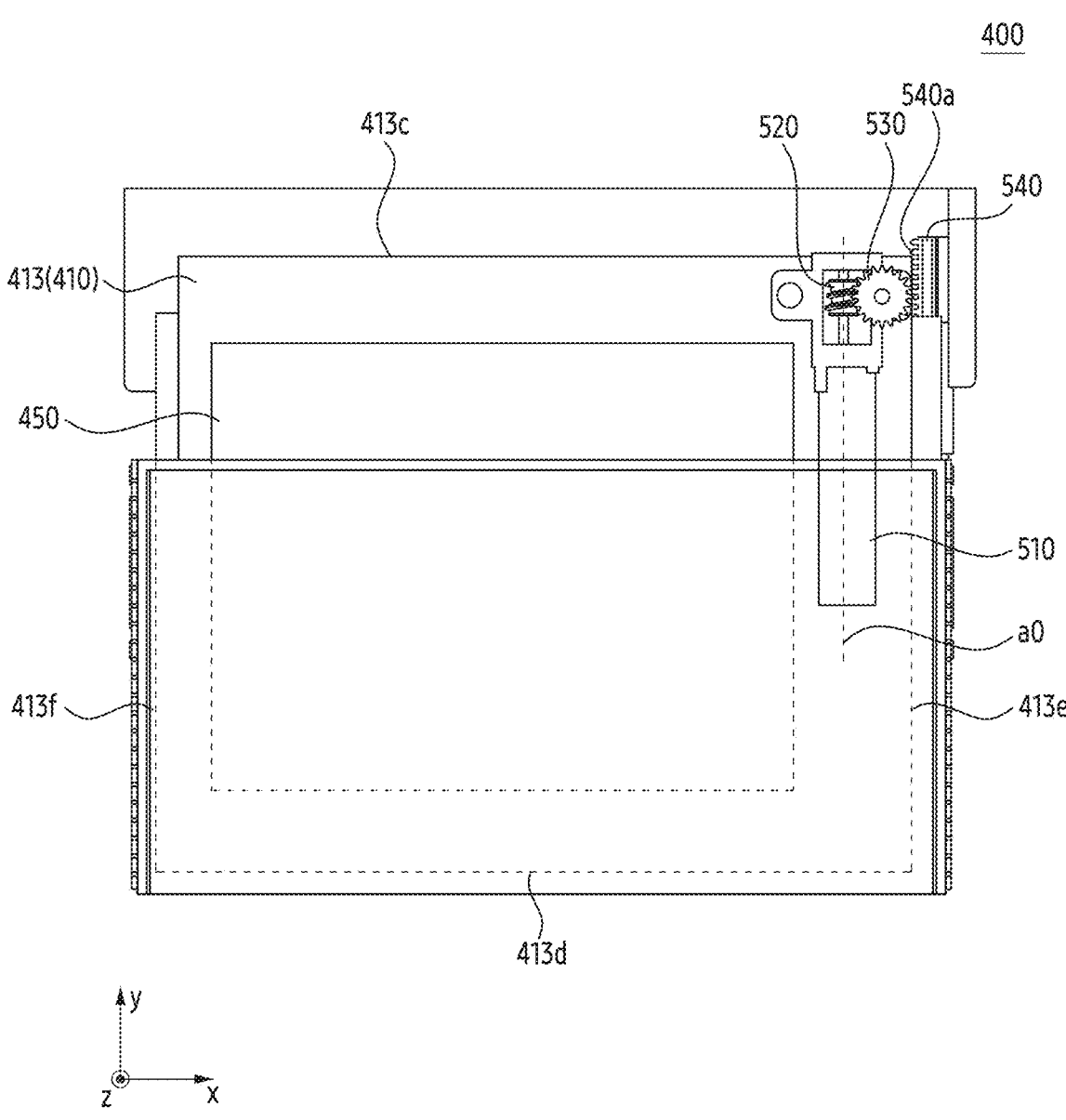
FIG. 8B is a rear view illustrating another example of a second housing and a driving module of an electronic device according to an embodiment.

FIG. 8A is a rear view illustrating an example of a second housing and a driving module of an electronic device according to an embodiment, and FIG. 8B is a rear view illustrating another example of a second housing and a driving module of an electronic device according to an embodiment.

Referring to FIGS. 8A and 8B, according to an embodiment, the electronic device 400 may further include a battery 450 (e.g., the battery 250 of FIGS. 3A and 3B). For example, the battery 450 may be disposed on the frame cover 413.

According to an embodiment, the rack gear 540 may be disposed on the outside of the frame cover 413. As the guide rail 432 provides a moving space for the rack gear 540 through an operating space (e.g., the operating space 432a in FIGS. 4A and 4B), the rack gear 540 may be movable in the outside of the frame cover 413. For example, when the first housing 410 is viewed from above (e.g., in −z direction), in case that the operating space 432a is formed inside the frame cover 413, a space for disposing the battery 450 within the frame cover 413 may become insufficient. The electronic device 400 according to an embodiment can provide a space for other components within the frame cover 413, with the operating space 432a formed outside the frame cover 413.

According to an embodiment, the driving shaft a0 of the motor 510 of the driving module 500 may be perpendicular to the gear surface 540a. For example, the motor 510 may be disposed on the first periphery 413c of the frame cover 413 as the driving shaft a0 of the motor 510 is perpendicular to the gear surface 540a. When the motor 510 is disposed on the first periphery 413c of the frame cover 413, a space for disposing the battery 450 is secured in part of the frame cover 413 except for the first periphery 413c. For example, in case the driving shaft a0 of the motor 510 is perpendicular to the gear surface 540a, the size of the battery 450 may extend in the direction toward the third periphery 413e or the fourth periphery 413f of the frame cover 413.

According to an embodiment, the drive shaft a0 of the motor 510 may be parallel to the gear surface 540a. For example, as the driving shaft a0 of the motor 510 is perpendicular to the gear surface 540a, the motor 510 may be disposed on the third periphery 413e of the frame cover 413. When the motor 510 is disposed on the third periphery 413e of the frame cover 413, an extra space may be secured to arrange the battery 450 on the other part of the frame cover 413 except for the third periphery 413e. For example, when the driving shaft a0 of the motor 510 is parallel to the gear surface 540a, the size of the battery 450 may extend in the direction toward the first periphery 413c or the second periphery 413d of the frame cover 413.

As described above, the electronic device 400 according to an embodiment can provide the structure for arranging the battery 450 with an increased size, with the motor 510 in which the driving shaft a0 is disposed perpendicular or parallel to the gear surface 540a. The larger size the battery 450 has, the more capacity and energy density the battery 450 may have, so that the electronic device 400 can smoothly provide various functions to the user.

Figure 9A:
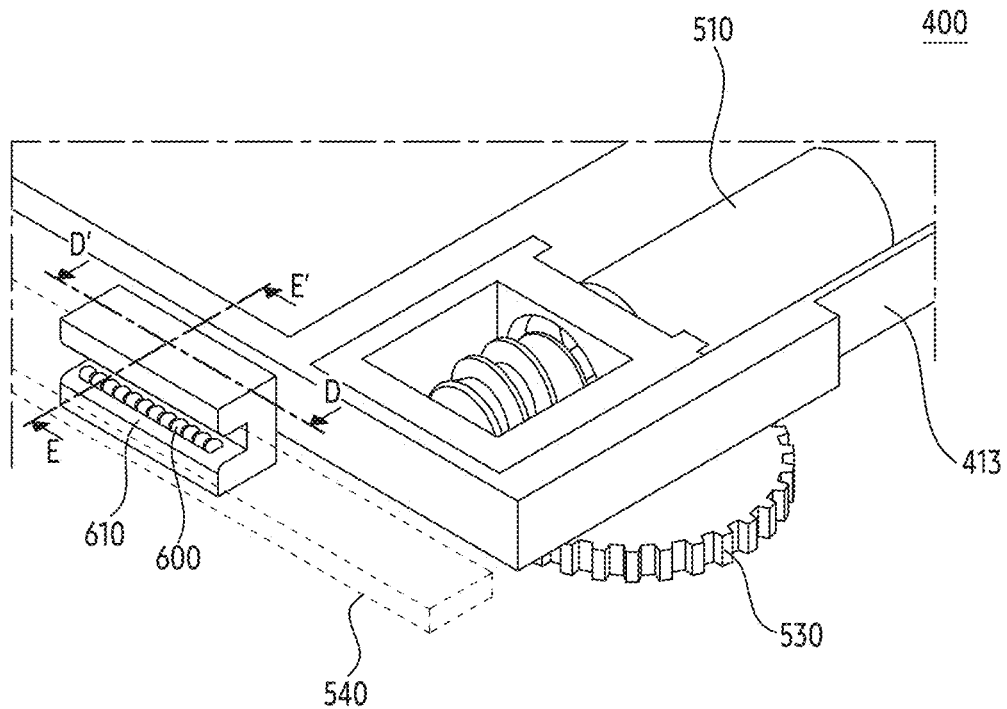
FIG. 9A is an enlarged perspective view illustrating a part of a second housing and a part of a driving module of an electronic device according to an embodiment.
Figure 9A:
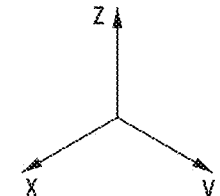
Figure 9B:
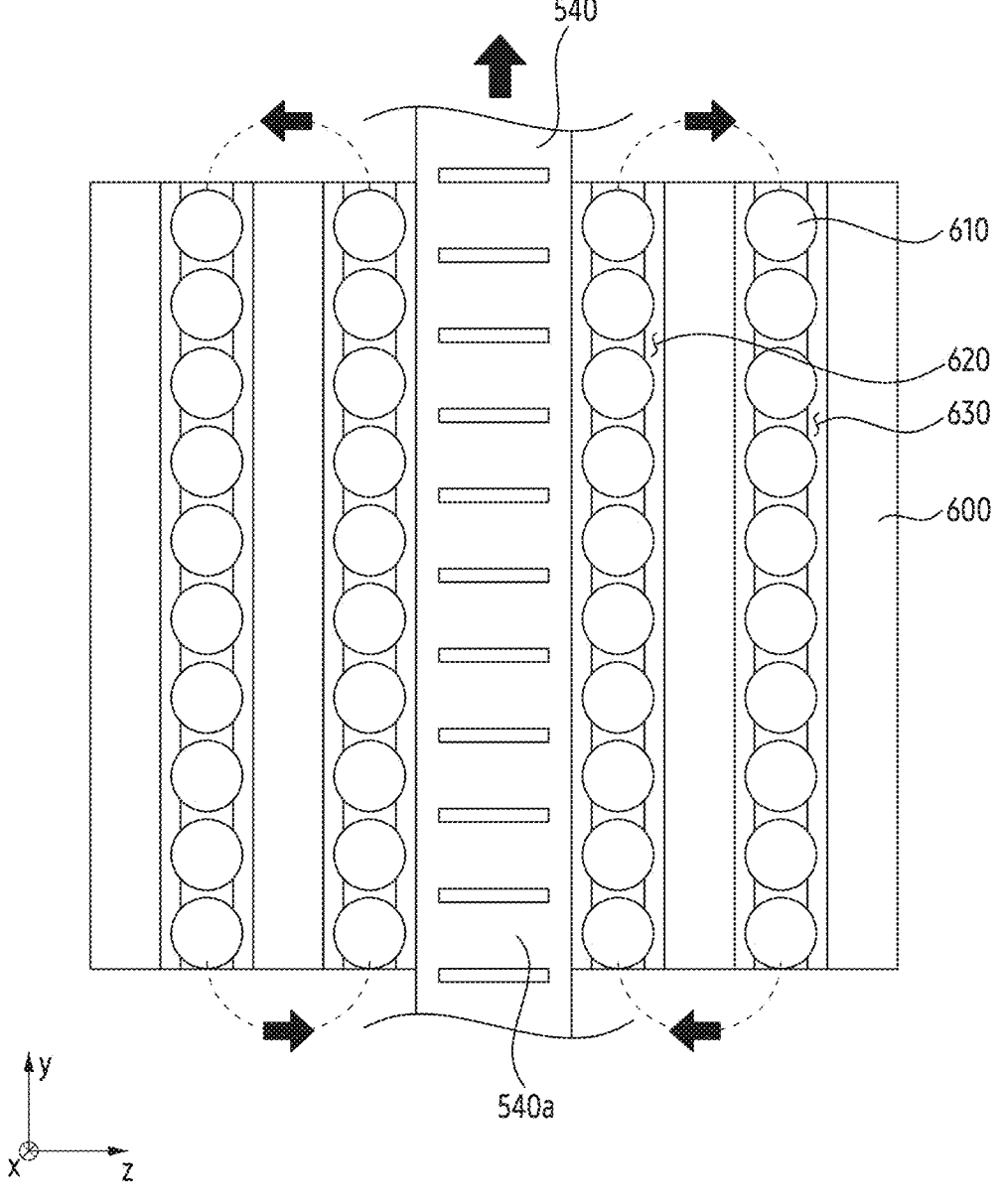
FIG. 9B is a cross-sectional view illustrating an example of an electronic device according to an embodiment taken along a line D-D' of FIG. 9A.
Figure 9C:
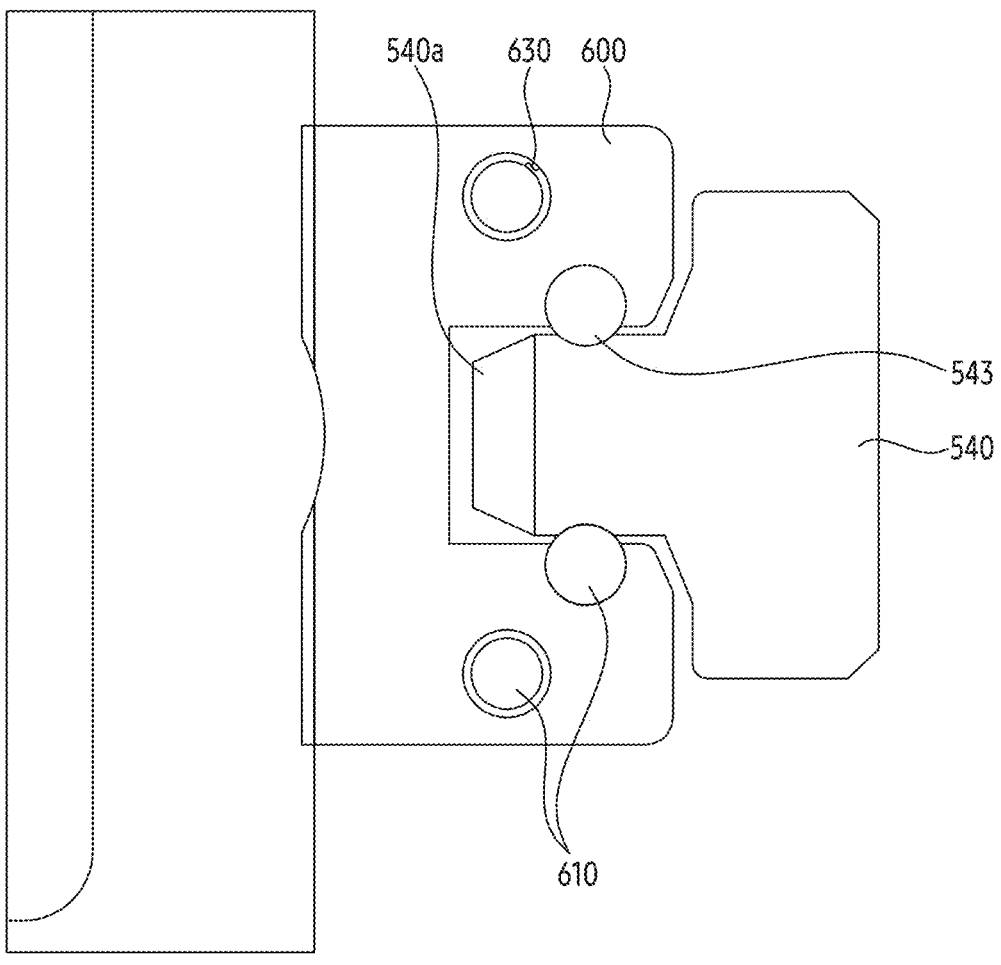
FIG. 9C is a cross-sectional view illustrating an example of an electronic device according to an embodiment taken along a line E-E' of FIG. 9A.
Figure 9C:
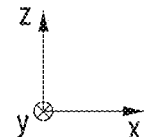

FIG. 9A is an enlarged perspective view illustrating a part of a second housing and a part of a driving module of an electronic device according to an embodiment, FIG. 9B is a cross-sectional view illustrating an example of an electronic device according to an embodiment taken along a line D-D' of FIGS. 9A and 9C is a cross-sectional view illustrating an example of an electronic device according to an embodiment taken along a line E-E' of FIG. 9A.

Referring to FIGS. 9A, 9B and 9C, according to an embodiment, a first guide member 600 may be disposed in a portion of the frame cover 413 facing the first direction (e.g., +y direction). For example, the first guide member 600 may be disposed on a portion of the frame cover 413 facing the transmission gear 530. According to an embodiment, the first guide member 600 may include a plurality of bearings 610 to guide the movement of the rack gear 540. The plurality of bearings 610 may be in contact with each other, and may be movable within the first guide member 600 according to the movement of the rack gear 540. For example, the plurality of bearings 610 may be ball bearings, but is not limited thereto.

According to an embodiment, the first guide member 600 may include a first space 620 in which the rack gear 540 is movable, and a second space 630 surrounding the first space 620 and being connected with the first space 620. The first space 620 may be opened toward the outside of the first guide member 600 to accommodate at least a portion of the rack gear 540. The rack gear 540, when the transmission gear 530 rotates, may be movable in the first direction or in the second direction (e.g., −y direction) opposite to the first direction within the first space 620. The second space 630 may be formed in the first guide member 600. The first space 620 and the second space 630 may be connected to each other. The first space 620 and the second space 630 may be connected to each other to form a moving path of the plurality of bearings 610 with a closed curve shape.

According to an embodiment, when the rack gear 540 is inserted into the first space 620, the plurality of bearings 610 may come into contact with the side surface 540b of the rack gear 540 perpendicular to the gear surface 540a. For example, at least some of the plurality of bearings 610 in contact with the side surface 540b of the rack gear 540 may be accommodated in the gear rail 543.

According to an embodiment, each of the plurality of bearings 610 may circulate within the first guide member 600 according to the movement of the rack gear 540, by contacting each other. For example, when the rack gear 540 is moved by the transmission gear 530, some of the plurality of bearings 610 disposed in the first space 620 may move along the moving direction of the rack gear 540, while coming into contact with the side surface 540b of the rack gear 540. Some of the plurality of bearings 610 may be pushed by other portions of the plurality of bearings 610 to reach the second space 630. Some of the plurality of bearings 610 reaching the second space 630 may move within the first guide member 600 along the direction opposite to the moving direction of the rack gear 540. Some of the plurality of bearings 610 moving in the direction opposite to the moving direction of the rack gear 540 may be pushed by other portions of the plurality of bearings 610, and may move from the second space 630 to the first space 620 again. As the plurality of bearings 610 circulate within the first guide member 600, a moving path of each of the plurality of bearings 610 may form a closed curve.

As described above, the electronic device (e.g., the electronic device 400 of FIGS. 4A and 4B) according to an embodiment can provide the structure for reducing friction generated according to the movement of the rack gear 540, owing to the first guide member having a plurality of bearings 610 to guide the movement of the rack gear 540. The electronic device 400 according to an embodiment can provide the structure capable of smoothly moving the second housing (e.g., the second housing 420 of FIGS. 4A and 4B) with respect to the first housing (e.g., the first housing 410 of FIGS. 4A and 4B), owing to the reduction in friction generated according to the movement of the rack gear 540.

Figure 10A:
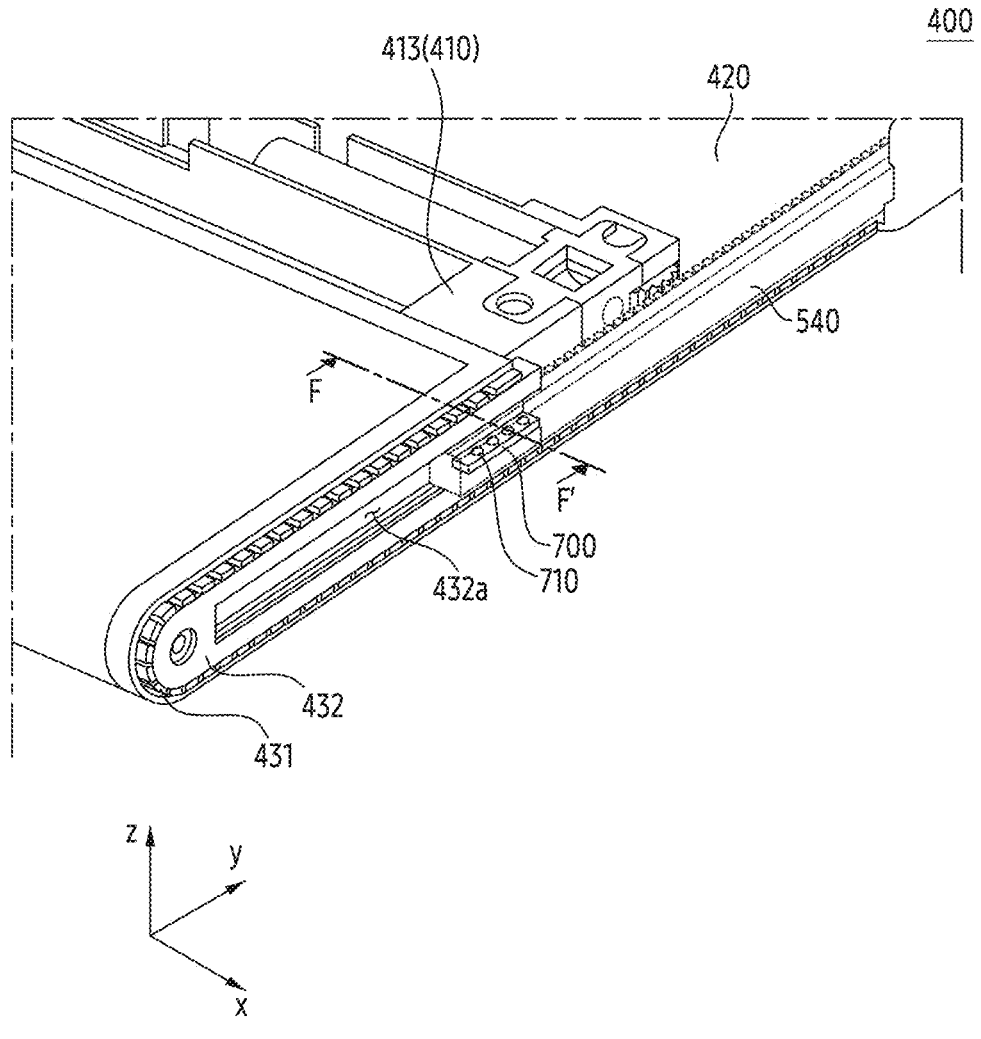
FIG. 10A is a perspective view of an electronic device according to an embodiment.
Figure 10B:
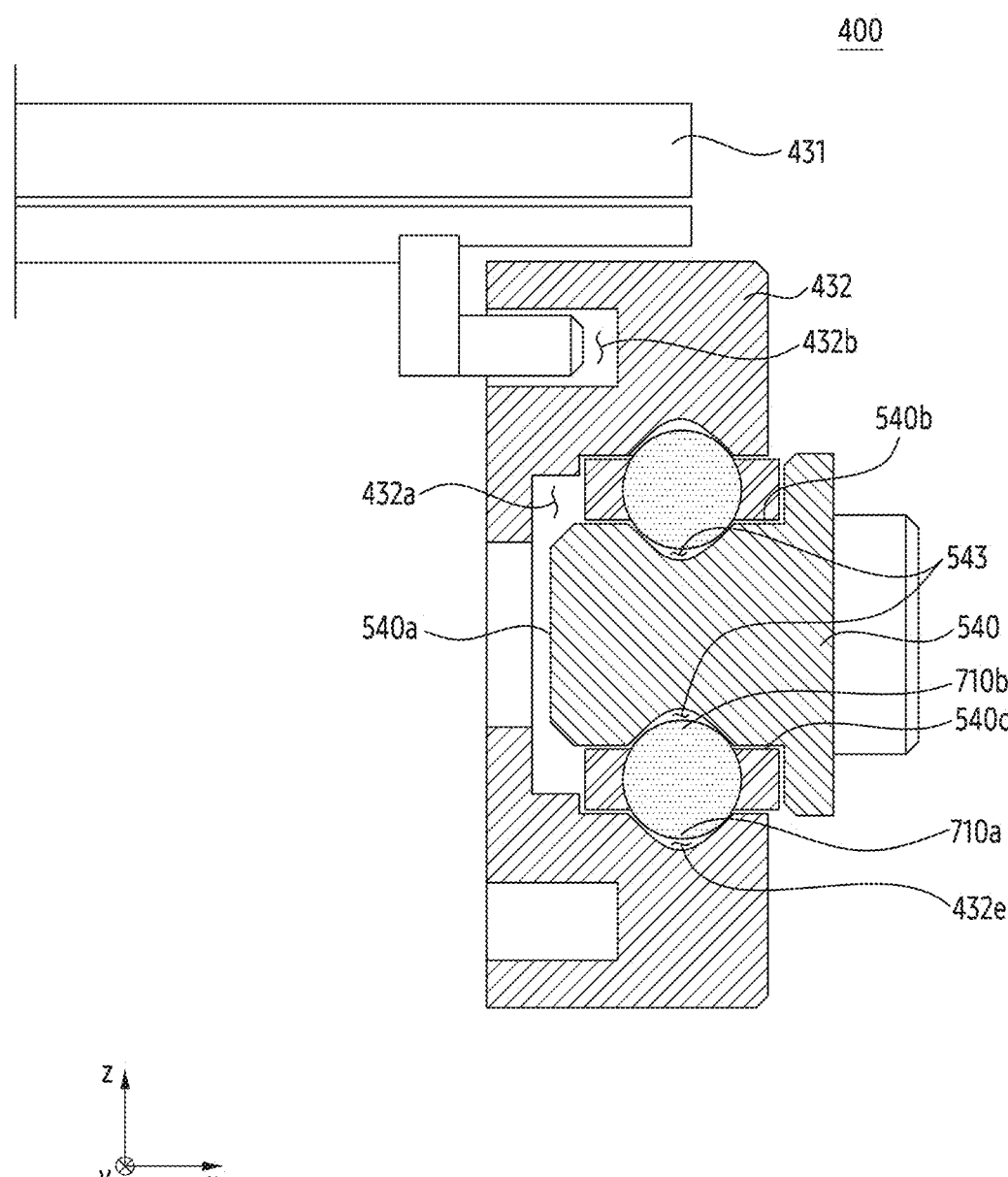
FIG. 10B is a cross-sectional view illustrating an example of the electronic device according to an embodiment taken along a line F-F' of FIG. 10A.

FIG. 10A is a perspective view of an electronic device according to an embodiment, and FIG. 10B is a cross-sectional view taken along a line F-F' of FIG. 10A of an example of the electronic device according to an embodiment.

Referring to FIGS. 10A and 10B, the electronic device 400 according to an embodiment may further include a second guide member 700. The second guide member 700 may guide the movement of the rack gear 540 and the second housing 420. According to an embodiment, the second guide member 700 may be disposed within the operating space 432a of the guide rail 432. For example, the second guide member 700 may be movable in the first direction (e.g., +y direction) or the second direction (e.g., −y direction) opposite to the first direction within the operating space 432a.

According to an embodiment, the second guide member 700 may include a plurality of bearings 710 for guiding the movement of the rack gear 540. The plurality of bearings 710 may reduce the friction generated according to the movement of the rack gear 540 so that the rack gear 540 can move smoothly within the operating space 432*a*. The plurality of bearings 710 may be in contact with the sides 540*b* and 540*c* of the rack gear 540 perpendicular to the gear surface 540*a* of the rack gear 540. According to an embodiment, the plurality of bearings 710 may be spaced apart from each other. For example, the plurality of bearings 710 may be spaced apart from each other in the first direction and arranged on the second guide member 700. For example, the plurality of bearings 710 may be ball bearings, but is not limited thereto.

According to an embodiment, the guide rail 432 may include a guide groove 432*b* to guide the movement of the support member 431. The guide groove 432*b* may surround at least a portion of the operating space 432*a*.

According to an embodiment, the guide rail 432 may include a first guide slit 432*e* for guiding the movement of the second guide member 700. The first guide slit 432*e* may receive a portion 710*a* of each of the plurality of bearings 710. The first guide slit 432*e* may extend along at least a portion of the operating space 432*a*. The first guide slit 432*e* may surround the second guide member 700. For example, the first guide slit 432*e* may be formed to be recessed in a direction (e.g., +z direction or −z direction) in which the inner surface of the guide rail 432 facing the operating space 432*a* is away from the operating space 432*a*. According to an embodiment, the gear rail 543 of the rack gear 540 may accommodate another portion 710*b* of each of the plurality of bearings 710.

According to an embodiment, when the rack gear 540 is inserted into the operating space 432*a* by the transmission gear 530, the second guide member 700 may be interposed between an inner surface of the guide rail 432 facing the operating space 432*a* and the sides 540*b* and 540*c* of the rack gear 540. When the second guide member 700 faces the inner surface of the guide rail 432 and the sides 540*b* and 540*c* of the rack gear 540, a portion 710*a* of each of the plurality of bearings 710 may be accommodated in the first guide slit 432*e*. The other portion 710*b* of each of the plurality of bearings 710 facing the portion 710*a* of each of the plurality of bearings 710 may be accommodated in the gear rail 543 of the rack gear 540.

As described above, the electronic device (e.g., the electronic device 400 of FIGS. 4A and 4B) according to an embodiment can provide the structure for reducing the friction generated according to the movement of the rack gear 540, owing to the second guide member 700 having a plurality of bearings 710 to guide the movement of the rack gear 540. The electronic device 400 according to an embodiment can provide the structure that the second housing 420 can smoothly move with respect to the first housing 410, owing to reduction in friction generated by the movement of the rack gear 540.

Figure 11A:
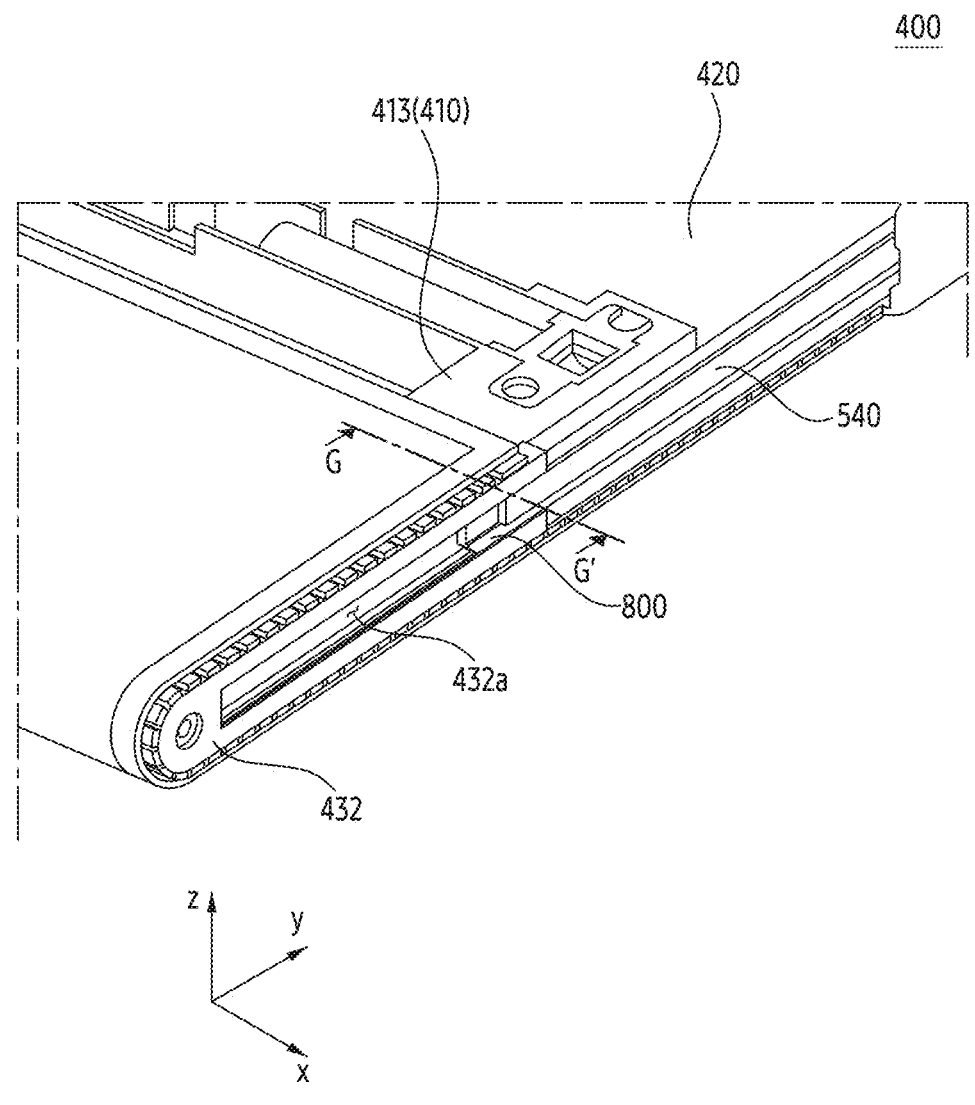
FIG. 11A is a perspective view of an electronic device according to an embodiment.
Figure 11B:
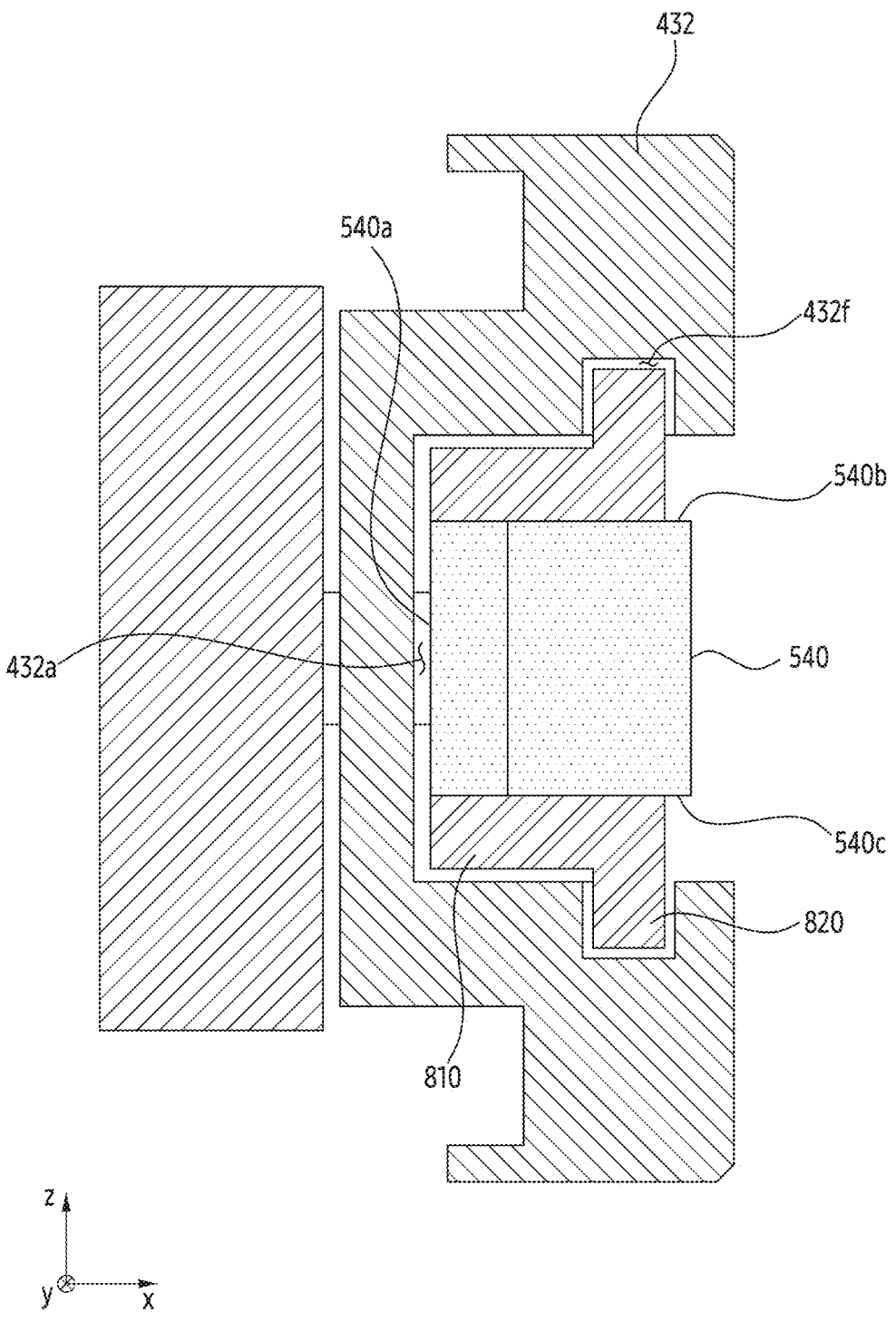
FIG. 11B is a cross-sectional view illustrating an example of an electronic device according to an embodiment taken along a line G-G' of FIG. 11A.

FIG. 11A is a perspective view illustrating an example of an electronic device according to an embodiment, and FIG. 11B is a cross-sectional view illustrating an example of an electronic device according to an embodiment taken along a line G-G' in FIG. 11A.

Referring to FIGS. 11A and 11B, the electronic device 400 according to an embodiment may further include at least one third guide member 800. The third guide member 800 may be disposed on the rack gear 540 to move together with the rack gear 540 according to the movement of the rack gear 540. According to an embodiment, the third guide members 800 may be disposed on the sides 540*b* and 540*c* of the rack gear 540 perpendicular to the gear surface 540*a* of the rack gear 540.

According to an embodiment, the guide rail 432 may include a third guide member 800 and a second guide slit 432*f* to guide the movement of the rack gear 540. The second guide slit 432*f* may be connected to the operating space 432*a* of the guide rail 432. For example, the second guide slit 432*f* may be formed with the inner surface of the guide rail 432 facing the operating space 432*a* being recessed in a direction away from the operating space 432*a* (e.g., +z direction or −z direction).

According to an embodiment, each of the third guide members 800 may include a first portion 810 extending along the sides 540*b* and 540*c* of the gear surface 540*a* of the rack gear 540 and a second portion 820 extending in a direction the side surfaces 540*b* and 540*c* of the gear surface 540*a* of the rack gear 540 face. The first portion 810 may be in contact with the side surfaces 540*b* and 540*c* of the rack gear 540 and may be disposed in the operating space 432*a* of the guide rail 432. The second portion 820 may be disposed in the second guide slit 432*f*.

According to an embodiment, as the rack gear 540 moves, the third guide member 800 may move together with the rack gear 540 within the operating space 432*a*. The inner wall of the second guide slit 432*f* in contact with the second portion 820 of the third guide member 800 may be configured to support the rack gear 540 so that the rack gear 540 is not inclined with respect to the first direction (e.g., +y direction) and/or in the second direction (e.g., −y direction). As the rack gear 540 is supported, the second housing 420 may not be inclined with respect to the first housing 410.

As described above, the electronic device 400 according to an embodiment can provide an extra space for other components within the electronic device 400, while preventing the rack gear 540 and the second housing 420 from being inclined, owing to the third guide member 800 coupled to the rack gear 540.

Figure 12:
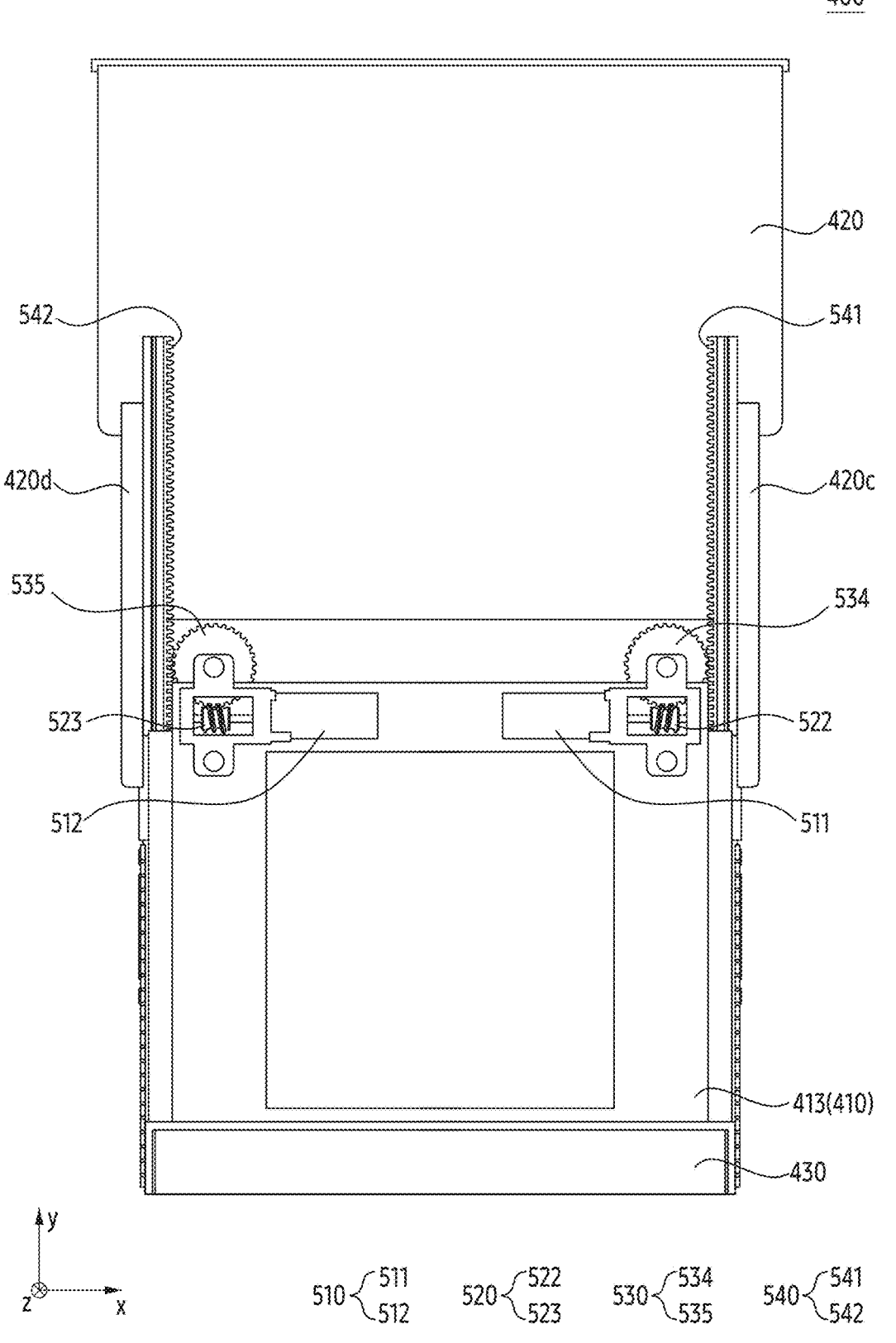
FIG. 12 is a rear view of an electronic device according to an embodiment.

FIG. 12 is a rear view illustrating an example of an electronic device according to an embodiment.

Referring to FIG. 12, according to an embodiment, the motor 510 may include a first motor 511 and a second motor 512 that are spaced apart from each other. The first motor 511 and the second motor 512 may be arranged to face each other and may be spaced apart from each other in a direction (e.g., +x direction) perpendicular to the moving direction of the second housing 420. For example, the first motor 511 may be arranged to face the first periphery 420*c* of the second housing 420, and the second motor 512 may be arranged to face the second periphery 420*d* of the second housing 420.

According to an embodiment, the driving gear 520 may include a first driving gear 522 and a second driving gear 523. The first driving gear 522 and the second driving gear 523 may be rotatably coupled to the first motor 511 and the second motor 512, respectively.

According to an embodiment, at least one transmission gear 530 may include a first transmission gear 534 and a second transmission gear 535. The first transmission gear 534 may mesh with the first drive gear 522, and the second transmission gear 535 may mesh with the second drive gear 523. The first transmission gear 534 may be rotatable about a rotation axis perpendicular to the rotation axis of the first driving gear 522. The second transmission gear 535 may be rotatable about a rotation axis perpendicular to the rotation axis of the second driving gear 523.

According to an embodiment, the first rack gear 541 may mesh with the first transmission gear 534, and the second rack gear 542 may mesh with the second transmission gear 535. For example, the first rack gear 541 may extend along the first periphery 420c of the second housing 420. For another example, the second rack gear 542 may extend along the second periphery 420d of the second housing 420.

According to an embodiment, when the first motor 511 and the second motor 512 operate, the first driving gear 522 and the second driving gear 523 may rotate, respectively. By rotation of the first drive gear 522 and the second drive gear 523, the first transmission gear 534 and the second transmission gear 535 rotate respectively, and the first rack gear 541 and the second rack gear 542 may move in the first direction (e.g., +y direction) or the second direction (e.g., −y direction). For example, in case where the motors 511 and 512 are arranged to face only the first periphery 420c of the second housing 420, a difference in driving force may occur between 420c the second periphery 420d and the first periphery of the second housing 420. When such a difference in driving force occurs, the second housing 420 may be inclined with respect to the first housing 410, and the display 430 may be damaged. The electronic device 400 according to an embodiment can prevent the second housing 420 from being inclined with respect to the first housing 410, with the motors 511 and 512 facing each of both the peripheries 420c and 420d of the second housing 420, thereby reducing damage to the display 430.

As apparent from the foregoing, the electronic device 400 according to an embodiment can provide the structure for reducing or at least alleviating the damage to internal components in the electronic device 400, with the motors 511 and 512 facing each of both the peripheries 420c and 420d of the second housing 420.

An electronic device (e.g., the electronic device 400 of FIGS. 4A and 4B) according to an embodiment may comprise a first housing (e.g., a first housing 410 of FIGS. 4A and 4B), a second housing (e.g., a second housing 420 of FIGS. 4A and 4B) slidably coupled to the first housing, and a display (e.g., a display 430 of FIGS. 4A and 4B) that is in contact with one surface of the second housing (e.g., other surface 420b of the second housing 420 of 4b of FIGS. 4A and 4B) and being slidable into or slidable out of the first housing according to the movement of the second housing. An electronic device according to an embodiment may comprise a motor (e.g., a motor 510 of FIGS. 4A and 4B) disposed in the first housing and providing a driving force for moving the second housing, and a driving gear (e.g., a driving gear 520 of FIGS. 4A and 4B) configured to rotate by the driving force applied from the motor. An electronic device according to an embodiment may comprise at least one transmission gear (e.g., a transmission gear 530 of FIGS. 4A and 4B) engaged with the driving gear so as to be rotatable about a rotation axis perpendicular to a rotation axis of the driving gear according to the rotation of the driving gear, and a rack gear (e.g., a rack gear 540 of FIGS. 4A and 4B) disposed in the second housing and capable of linearly reciprocating according to rotation of the at least one transmission gear. According to an embodiment, the rack gear may comprise a gear surface (e.g., a gear surface 540a of FIGS. 4A and 4B) having a plurality of teeth meshing with the at least one transmission gear, and facing in a direction distinct from the direction the one surface of the second housing faces. According to an embodiment, the plurality of teeth meshing with the at least one transmission gear included in the rack gear 540 (e.g., a rack gear 263 of FIG. 3B) may be formed in a direction parallel to the display 230 disposed on the second housing 220.

According to an embodiment, the electronic device may comprise a plurality of bars extending in a direction perpendicular to the moving direction of the second housing, and further comprise a support member (e.g., a support member 431 of FIGS. 4A and 4B) that is in contact with at least a portion of the display. According to an embodiment, the electronic device may comprise a guide rail (e.g., a guide rail 432 of FIGS. 4A and 4B) disposed in the first housing and configured to guide movement of the support member. According to an embodiment, the guide rail may comprise an operation space (e.g., an operation space 432a of FIGS. 4A and 4B) surrounding at least a portion of the rack gear.

According to an embodiment, the rack gear may be spaced apart from the driving gear.

According to an embodiment, the at least one transmission gear may comprise a first gear (e.g., a first gear in FIG. 6) engaged with the driving gear to be rotatable with respect to a rotation axis perpendicular to the rotation axis of the driving gear. According to an embodiment, the at least one transmission gear may comprise a second gear (e.g., the second gear 532 of FIG. 6) coaxial to the first gear and rotatable by rotation of the first gear.

According to an embodiment, the second gear may be disposed on the first gear to move the rack gear as it rotates by the first gear.

According to an embodiment, the electronic device may further comprise a shaft (e.g., a shaft 501 of FIG. 6) extending along the rotation axis of the first gear and the second gear.

According to an embodiment, the at least one transmission gear may further comprise a third gear (e.g., a third gear 533 of FIG. 7) that is rotatable with respect to a rotation axis parallel to a rotation axis of the second gear and engaged with the second gear and the rack gear.

According to an embodiment, the driving gear may comprise at least one selected from a worm gear, a bevel gear, a screw gear, or a combination thereof, and the at least one transmission gear may comprise at least one selected from a worm wheel gear, a bevel gear, a screw gear, a pinion gear, or a combination thereof.

According to an embodiment, the drive shaft of the motor may be parallel to a direction which the gear surface faces.

According to an embodiment, the driving shaft of the motor may be perpendicular to a direction which the gear surface faces.

According to an embodiment, the electronic device may further comprise a second rack gear (e.g., a second rack gear of FIGS. 4A and 4B) distinguished from a first rack gear, the first rack gear being the rack gear, the second rack gear being space apart from the first rack gear and facing the first rack gear.

According to an embodiment, the electronic device may further comprise a second transmission gear (e.g., the second transmission gear 535 of FIG. 12) configured to mesh with the second rack gear and distinguished from a first transmission gear (e.g., a first transmission gear 534 of FIG. 12) that is the transmission gear, the second transmission gear being rotatable with respect to a rotation axis parallel to a rotation axis of the first transmission gear. According to an embodiment, the electronic may further comprise a second driving gear (e.g., a second driving gear 523 of FIG. 12) configured to mesh with the second transmission gear and distinguished from a first drive gear that is the drive gear (e.g., the first drive gear 522 of FIG. 12), the second driving gear being rotatable with respect to a rotation axis perpendicular to a rotation axis of the second transmission gear. According to an embodiment, the electronic device may further comprise a second motor (e.g., a second motor 512 of FIG. 12) coupled to the second driving gear and distinguished from a first motor that is the motor, the second motor rotating the second driving gear.

According to an embodiment, the rack gear may comprise a gear rail (e.g., a gear rail 543 of FIGS. 4A and 4B) disposed on the side surface of the rack gear perpendicular to the gear surface (e.g., the side surface 540*b* of FIGS. 4A and 4B) and extending along a moving direction of the rack gear. According to an embodiment, the electronic device may further comprise a plurality of bearings (e.g., bearings 610 of FIGS. 9A, 9B, and 9C) disposed in the first housing, at least a portion of which bearings is in contact with the gear rail, and a first guide member (e.g., a first guide member 600 of FIGS. 4A and 4B) for guiding movement of the rack gear and the second housing.

According to an embodiment, in the electronic device, a portion of the plurality of bearings may be movable within the first guide member by other portion of the plurality of bearings according to the movement of the rack gear.

According to an embodiment, the rack gear may perform linear reciprocating movement within the operating space according to the movement of the second housing.

According to an embodiment, the first housing may further comprise a frame cover (e.g., a frame cover 413 of FIGS. 4A and 4B) disposed in the first housing and coupled to the at least one transmitting gear, and a motor. According to an embodiment, the guide rail may be disposed to a periphery of the frame cover (e.g., a third periphery 413*e* of the frame cover 413 of FIGS. 4A and 4B) facing a direction perpendicular to the moving direction of the second housing.

According to an embodiment, the guide rail may further comprise a guide groove (e.g., a guide groove 432*b* in FIG. 5) that is separated from at least a portion of the operating space and guides the movement of the support member. According to an embodiment, each of the plurality of bars may comprise a guide protrusion (e.g., a guide projection 431*a* of FIG. 5) that is movable within the guide groove according to the movement of the second housing.

According to an embodiment, the electronic device may further comprise a second guide member (e.g., a second guide member 700 of FIGS. 10A and 10B) that is disposed in the operating space and movable within the operating space. According to an embodiment, the second guide member may comprise a plurality of bearings (e.g., a plurality of bearings 710 in FIGS. 10A and 10B) that guide the movement of the rack gear and are spaced apart from each other.

According to an embodiment, the guide rail may further comprise a first guide slit (e.g., a first guide slit 432*e* of FIGS. 10A and 10B) that is in contact with a portion of each of the plurality of bearings and extends along the operating space. According to an embodiment, the other portion of each of the plurality of bearings may be configured to face the portion of each of the plurality of bearings, and be in contact with a side surface of the rack gear perpendicular to the gear surface.

According to an embodiment, the rack gear may further comprise a third guide member (e.g., a third guide member 800 of FIGS. 11A and 11B) disposed on a side surface of the rack gear perpendicular to the gear surface. According to an embodiment, the guide rail may further comprise a second guide slit (e.g., a second guide slit 432*f* of FIGS. 11A and 11B) connected to the operating space and accommodating a portion of the third guide member.

According to an embodiment, the electronic device (e.g., an electronic device 400 of FIGS. 4A and 4B) may comprise a first housing (e.g., a first housing 410 of FIGS. 4A and 4B), a second housing (e.g., a second housing 420 of FIGS. 4A and 4B) movably coupled to the first housing, and a display (e.g., a display 430 of FIGS. 4A and 4B) including a first region (e.g., a first region 230*a* of FIGS. 3A and 3B) disposed on one surface of the second housing and a second region (e.g., a second region 230*b* of FIGS. 3A and 3B) deformable according to movement of the second housing. According to an embodiment, the electronic device may comprise a supporting member (e.g., a support member 431 of FIGS. 4A and 4B) including at least one bar extending in a direction perpendicular to a moving direction of the second housing, the supporting member disposed in the second region of the display. According to an embodiment, the electronic device may comprise a guide rail (e.g., a guide rail 432 of FIGS. 4A and 4B) disposed in the first housing and configured to guide movement of the supporting member. According to an embodiment, the electronic device may comprise a motor (e.g., a motor 510 of FIGS. 4A and 4B) disposed in the first housing and configured to provide a driving force to the second housing, a driving gear (e.g., a driving gear 520 of FIGS. 4A and 4B) coupled to the motor to be rotatable with respect to the motor, and at least one transmitting gear (e.g., a transmission gear 530 in FIGS. 4A and 4B) engaged with the driving gear to be rotatable with respect to a rotation axis perpendicular to a rotation axis of the driving gear by rotation of the driving gear. According to an embodiment, the electronic device may comprise a rack gear (e.g., a rack gear 540 of FIGS. 4A and 4B) including a gear surface (e.g., a gear surface 540*a* of FIGS. 4A and 4B) facing a direction perpendicular to a direction the one surface of the second housing faces, the gear surface including a plurality of teeth engaged with the at least one transmitting gear, the rack gear being disposed on the second housing, the rack gear moving by rotation of the at least one transmitting gear. According to an embodiment, the guide rail may comprise an operating space accommodating at least part of the rack gear to guide the movement of the rack gear.

According to an embodiment, the first housing may comprise a frame cover (e.g., a frame cover 413 of FIGS. 4A and 4B) for accommodating the motor and the at least one transmission gear. According to an embodiment, the guide rail may be disposed at a periphery of the frame cover facing a direction perpendicular to the moving direction of the second housing.

According to an embodiment, the rack gear may comprise a gear rail (e.g., a gear rail 543 of FIGS. 4A and 4B) disposed on a side surface (e.g., a side surface 540*b* of FIGS. 4A and 4B) of the rack gear perpendicular to the gear surface, and extending along the side surface of the rack gear. According to an embodiment, the electronic device may further comprise a first guiding member (e.g., a first guide member 600 of FIGS. 4A and 4B) including a plurality of the bearings (e.g., bearings 610 of FIGS. 9A, 9B, and 9C) at least partially accommodated in the gear rail, the first guiding member being disposed in the first housing and configured to guide movement of the rack gear and the second housing.

According to an embodiment, the at least one transmission gear may further comprise a first gear (e.g., a first gear 531 of FIG. 6) that is rotatably engaged with the driving gear so as to be rotatable about a rotation axis perpendicular to a rotation axis of the driving gear. According to an embodiment, the at least one transmission gear may further comprise a second gear (e.g., a second gear 532 of FIG. 6) coaxially formed with the first gear and rotatable according to rotation of the first gear.

According to an embodiment, the rack gear may be inserted into the operating space or pulled out from the operating space as the second housing moves.

According to an embodiment, the electronic device may further comprise a second guide member (e.g., a second guide member 700 of FIGS. 10A and 10B) disposed in the operating space and movable within the operating space. According to an embodiment, the second guide member may comprise a plurality of bearings (e.g., a plurality of bearings 710 of FIGS. 10A and 10B) that guide the movement of the rack gear and are spaced apart from each other.

According to an embodiment, the rack gear may further comprise a third guide member (e.g., a third guide member 800 of FIGS. 11A and 11B) disposed on a side surface of the rack gear perpendicular to the gear surface. According to an embodiment, the guide rail may further comprise a second guide slit (e.g., a second guide slit 432_f_ of FIGS. 11A and 11B) that is connected to the operating space to guide movement of the third guide member.

Since many features, except those of the independent claims, are optional only, the features of the preferred embodiments have been described in connection with "may". Nevertheless, said preferred embodiments have to understood to be disclosed as specific preferred combinations as shown in the drawings and therefore features shown in the drawings are to be understood as a real preferred combination for the present invention which however does not restrict the scope of the invention.

The electronic device according to various embodiments disclosed herein may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., a program 140) including one or more instructions that are stored in a storage medium (e.g., an internal memory 136 or an external memory 138) that is readable by a machine (e.g., an electronic device 101). For example, a processor (e.g., a processor 120 of an electronic device 101) of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:

a first housing;

a second housing movably coupled to the first housing;

a display disposed on one surface of the second housing and expanded or contracted by movement of the second housing with respect to the first housing;

a motor disposed in the first housing and configured to provide a driving force to the second housing;

a driving gear coupled to the motor to be rotatable with respect to the motor;

at least one transmitting gear engaged with the driving gear to be rotatable with respect to a rotation axis perpendicular to a rotation axis of the driving gear by rotation of the driving gear;

a rack gear including a gear surface facing a direction perpendicular to a direction the one surface of the second housing faces, the gear surface including a plurality of teeth engaged with the at least one transmitting gear, the rack gear disposed on the second housing, the rack gear being moved by rotation of the at least one transmitting gear;

a supporting member disposed on at least part of the display and extending along a direction perpendicular to a moving direction of the second housing; and a guide rail disposed in the first housing and configured to guide movement of the supporting member, wherein the guide rail includes an operating space accommodating at least part of the rack gear.

2. The electronic device of claim 1, wherein the rack gear is spaced apart from the driving gear when the first housing is viewed from above.

3. The electronic device of claim 1, wherein the at least one transmitting gear comprises:

a first gear engaged with the driving gear to be rotatable with respect to a rotation axis perpendicular to the rotation axis of the driving gear; and a second gear coaxial to the first gear and rotatable by a rotation of the first gear.

4. The electronic device of claim 3, wherein the second gear is disposed on the first gear and engaged with at least part of the plurality of teeth of the gear surface.

5. The electronic device of claim 3, wherein the at least one transmitting gear further includes a third gear rotatable with respect to a rotation axis parallel to a rotation axis of the second gear and engaged with the second gear and at least part of the plurality of teeth of the gear surface.

6. The electronic device of claim 1, wherein a driving axis of the motor is perpendicular to the gear surface.

7. The electronic device of claim 1, wherein a driving axis of the motor is parallel to the gear surface.

8. The electronic device of claim 1, wherein the rack gear is disposed to a first periphery of the second housing, and wherein the electronic device further comprising a second rack gear distinct from a first rack gear, the first rack gear which is the rack gear, disposed on a second periphery of the second housing facing the first periphery of the second housing.

9. The electronic device of claim 8, further comprising:

a second transmitting gear distinct from a first transmitting gear which is the transmitting gear, second transmitting gear being engaged with the second rack gear and rotatable with respect to a rotation axis parallel to the rotation axis of the first transmitting gear;

a second driving gear distinct from a first driving gear which is the driving gear, the second driving gear being engaged with the second transmitting gear and rotatable with respect to a rotation axis perpendicular to the rotation axis of the second transmitting gear; and a second motor distinct from a first motor which is the motor, the second motor being coupled to the second driving gear.

10. The electronic device of claim 1, wherein the rack gear further includes a gear rail disposed to a side surface of the rack gear perpendicular to the gear surface, and extending along the side surface of the rack gear; and wherein the electronic device further comprising a first guiding member including a plurality of bearings at least partially accommodated in the gear rail, the first guiding member being disposed in the first housing and configured to guide movement of the rack gear and the second housing.

11. The electronic device of claim 10, wherein the plurality of bearings are in contact with each other within the first guiding member and are movable within the first guiding member as the rack gear moves.

12. The electronic device of claim 1, wherein the rack gear is inserted into the operating space or pulled out from the operating space as the second housing moves.

13. The electronic device of claim 1, wherein the first housing further includes a frame cover disposed in the first housing and coupled to the at least one transmitting gear, and the motor, and wherein the guide rail is disposed to a periphery of the frame cover, the periphery of the frame cover facing a direction perpendicular to the moving direction of the second housing.

14. The electronic device of claim 1, wherein the guide rail further includes a guiding groove surrounding at least part of the operating space, the guide rail being configured to guide movement of the supporting member, and wherein the supporting member includes a plurality of bars supporting the display and spaced apart from each other, each of the plurality of bars including a guiding protrusion movable within the guiding groove as the second housing moves.

15. The electronic device of claim 1, further comprising:

a second guiding member disposed in the operating space and movable within the operating space, wherein the second guiding member includes a plurality of bearings spaced apart from each other and configured to guide movement of the rack gear.

16. The electronic device of claim 15, wherein the guide rail further includes a first guide slit extending along the operating space to accommodate one part of each of the plurality of bearings, and wherein other part of the plurality of bearings faces the one part of each of the plurality of bearings, the other part of the plurality of bearings being in contact with a side surface of the rack gear perpendicular to the gear surface.

17. The electronic device of claim 1, wherein the rack gear further includes a third guiding member disposed to a side surface of the rack gear perpendicular to the gear surface, and wherein the guide rail further includes a second guide slit connected to the operating space and configured to guide movement of the third guiding member.

18. An electronic device comprising:

a first housing;

a second housing movably coupled to the first housing;

a display including a first region disposed on one surface of the second housing and a second region deformable as the second housing moves with respect to the first housing;

a supporting member including at least one bar extending in a direction perpendicular to a moving direction of the second housing, the supporting member disposed in the second region of the display;

a guide rail disposed in the first housing and configured to guide movement of the supporting member;

a motor disposed in the first housing and configured to provide a driving force to the second housing;

a driving gear coupled to the motor to be rotatable with respect to the motor;

at least one transmitting gear engaged with the driving gear to be rotatable with respect to a rotation axis perpendicular to a rotation axis of the driving gear by rotation of the driving gear; and a rack gear including a gear surface facing a direction perpendicular to a direction the one surface of the second housing faces, the gear surface including a plurality of teeth engaged with the at least one transmitting gear, the rack gear being disposed on the second housing, the rack gear moving by rotation of the at least one transmitting gear, wherein the guide rail includes an operating space accommodating at least part of the rack gear.

19. The electronic device of claim 18, wherein the rack gear further includes a gear rail disposed to a side surface of the rack gear perpendicular to the gear surface, and extending along the side surface of the rack gear; and wherein the electronic device further comprising a first guiding member including a plurality of bearings at least partially accommodated in the gear rail, the first guiding member being disposed in the first housing and configured to guide movement of the rack gear and the second housing.

20. The electronic device of claim 18, wherein the rack gear is inserted into the operating space or pulled out from the operating space as the second housing moves.

* * * * *